(12) United States Patent
Miao

(10) Patent No.: US 9,758,682 B2
(45) Date of Patent: Sep. 12, 2017

(54) INK COMPOSITION, METHOD OF METALIZING SURFACE AND ARTICLE OBTAINABLE

(71) Applicants: SHENZHEN BYD AUTO R&D COMPANY LIMITED, Shenzhen, Guangdong (CN); BYD COMPANY LIMITED, Shenzhen, Guangdong (CN)

(72) Inventor: Weifeng Miao, Guangdong (CN)

(73) Assignees: SHENZHEN BYD AUTO R&D COMPANY LIMITED, Shenzhen (CN); BYD COMPANY LIMITED, Shenzhen (CN)

( * ) Notice: Subject to any disclaimer, the term of this patent is extended or adjusted under 35 U.S.C. 154(b) by 436 days.

(21) Appl. No.: 14/315,137

(22) Filed: Jun. 25, 2014

(65) Prior Publication Data

US 2014/0308531 A1    Oct. 16, 2014

Related U.S. Application Data

(63) Continuation of application No. PCT/CN2012/087590, filed on Dec. 26, 2012.

(30) Foreign Application Priority Data

Dec. 27, 2011 (CN) .......................... 2011 1 0442474
Dec. 27, 2011 (CN) .......................... 2011 1 0442481

(51) Int. Cl.

| C09D 11/322 | (2014.01) |
| C09D 11/037 | (2014.01) |
| C09D 11/52  | (2014.01) |
| H05K 1/09   | (2006.01) |
| H05K 3/24   | (2006.01) |
| C09D 11/02  | (2014.01) |

(52) U.S. Cl.
CPC ............ *C09D 11/02* (2013.01); *C09D 11/037* (2013.01); *C09D 11/322* (2013.01); *C09D 11/52* (2013.01); *H05K 1/097* (2013.01); *H05K 3/246* (2013.01)

(58) Field of Classification Search
CPC ..... C09D 11/52; C09D 11/037; C09D 11/322; H05K 1/097; H05K 3/246
USPC ............... 106/31.9, 31.92; 427/404; 428/471
See application file for complete search history.

(56) References Cited

U.S. PATENT DOCUMENTS

| 7,115,216 B2* | 10/2006 | Carter .................... | C09D 11/50 |
| | | | 252/301.16 |
| 7,736,538 B2* | 6/2010 | Gros ..................... | B23K 35/226 |
| | | | 204/488 |
| 9,512,522 B2* | 12/2016 | Miao ..................... | H05K 1/097 |
| 2003/0185971 A1* | 10/2003 | Saksa .................... | C09D 11/52 |
| | | | 427/98.4 |
| 2007/0032573 A1* | 2/2007 | Yanagase ............. | C09D 11/037 |
| | | | 106/31.6 |
| 2007/0187653 A1* | 8/2007 | Takeda ................. | B82Y 30/00 |
| | | | 252/500 |
| 2008/0044559 A1* | 2/2008 | Noh ...................... | G03F 7/0042 |
| | | | 427/145 |
| 2009/0214839 A1* | 8/2009 | Kotsubo ............... | H05K 3/182 |
| | | | 428/209 |
| 2009/0246357 A1* | 10/2009 | Liou ..................... | H05K 3/105 |
| | | | 427/97.3 |
| 2009/0286006 A1* | 11/2009 | Lin ....................... | C09D 11/52 |
| | | | 106/31.13 |
| 2010/0135937 A1 | 6/2010 | O'Brien et al. | |
| 2010/0167078 A1* | 7/2010 | Kim ...................... | B22F 1/0018 |
| | | | 106/31.13 |
| 2014/0290530 A1* | 10/2014 | Gong .................... | C09D 11/322 |
| | | | 106/1.26 |
| 2014/0308450 A1* | 10/2014 | Miao .................... | C09D 11/52 |
| | | | 427/377 |

FOREIGN PATENT DOCUMENTS

| CN | 1400107 A | 3/2003 |
| CN | 1662616 A | 8/2005 |
| CN | 1797614 A | 7/2006 |
| CN | 101023498 A | 8/2007 |
| CN | 101580657 A | 11/2009 |
| CN | 101612861 A | 12/2009 |
| CN | 101921505 A | 12/2010 |
| CN | 103095866 A | 5/2013 |
| EP | 0913432 | 5/1999 |
| EP | 1536251 A1 | 6/2005 |
| EP | 1666541 A1 | 6/2006 |
| EP | 2048930 A1 | 4/2009 |
| JP | 5515869 B2 | 2/1980 |
| JP | 58-044077 A | 9/1983 |
| JP | 2005-082472 | 3/2005 |

(Continued)

OTHER PUBLICATIONS

English translation of CN 1400107, Mar. 2003; 8 pages.*
PCT International Search Report mailed Apr. 4, 2013, issued in International Application No. PCT/CN2012/087590 (5 pages).
Tingfeng Tan et al., "Polymer-Induced Generation and Characterization of Electrophoretic Properties of Hollow $TiO_x$ Nanospheres for Electronic Paper", *Synthetic Metals*, vol. 159, Issues 17-18, Sep. 2009, pp. 1739-1743.

(Continued)

*Primary Examiner* — Helene Klemanski

(57) ABSTRACT

An ink composition is provided, a method of metalizing a surface of an insulation substrate and an article obtainable by the method are also provided. The ink composition may comprise a metal compound and an ink vehicle, the metal compound is at least one selected from a group consisting of a compound of formula I and a compound of formula II, $TiO_{2-\sigma}$ (I), $M^1M^2_pO_q$ (II), $0.05 \leq \sigma < 1.8$, $M^1$ is at least one element selected from a group consisting of groups 2, 9-12 of the periodic table according to IUPAC nomenclature, $M^2$ is at least one element selected from a group consisting of groups 3-8, 10 and 13 of the periodic table according to IUPAC nomenclature, and $0 < p \leq 2$, and $0 < q < 4$.

19 Claims, No Drawings

(56) References Cited

FOREIGN PATENT DOCUMENTS

| | | |
|---|---|---|
| JP | 2008-047874 A | 2/2008 |
| JP | 2008-085305 A | 4/2008 |
| JP | 2010-143982 A | 7/2010 |
| JP | 2010-162685 A | 7/2010 |
| JP | 2010-229378 A | 10/2010 |
| JP | 2015-507698 A | 3/2015 |
| KR | 10-2008-00160025 A | 2/2008 |
| WO | WO 03/053707 A2 | 7/2003 |
| WO | WO-2006/046607 | 5/2006 |
| WO | WO-2008/001354 | 1/2008 |
| WO | WO 2009/024776 A1 | 2/2009 |
| WO | WO 2009/137637 A2 | 11/2009 |
| WO | WO 2013/097729 A1 | 7/2013 |
| WO | WO-2014/019495 | 2/2014 |

OTHER PUBLICATIONS

PCT International Preliminary Report on Patentability dated Jul. 1, 2014, issued in related International Application No. PCT/CN2012/087590 (8 pages).

* cited by examiner

INK COMPOSITION, METHOD OF METALIZING SURFACE AND ARTICLE OBTAINABLE

CROSS-REFERENCE TO RELATED APPLICATIONS

This application is a continuation application of International Application No. PCT/CN2012/087590, filed on Dec. 26, 2012, which claims priority to and benefits of Chinese Patent Application Serial Nos. 201110442481.8 and 201110442474.8, both filed with the State Intellectual Property Office (SIPO) of P. R. China on Dec. 27, 2011. The entire contents of the above-mentioned applications are incorporated herein by reference.

FIELD

The present disclosure relates to the field of material science, more particularly to an ink composition, a method of metalizing a surface of an insulation substrate, and an article obtainable by the method.

BACKGROUND

The statements in this section merely provide background information related to the present disclosure and may not constitute prior art.

A metallic layer can be formed on an insulation substrate surface as an electromagnetic signal transduction pathway, which has been applied in the fields, such as automobile, computer, and communication. Plenty of means may be used to form the metallic layer on the surface of an insulation substrate, for example plastic.

However, the means for metalizing a surface of an insulation substrate needs to be further improved.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In viewing thereof, the present disclosure is directed to solve at least one of the problems existing in the art. Accordingly, means for metalizing a surface of an insulation substrate may be provided.

The present disclosure is accomplished on the basis of: an ink composition may be prepared by mixing a compound of $TiO_{2-\sigma}$ ($0.05 \leq \sigma < 1.8$) and an ink vehicle, and then the ink composition may be applied to a surface of an insulation substrate to be formed with lines thereon, and an ink layer may be formed on at least a part of surface of the insulation substrate; then a metallic layer may be formed on the insulation surface having the ink layer by means of chemical plating or electrical plating, and further a signal transduction pathway may be formed directly on the insulation substrate surface.

According to a first aspect of the present disclosure, there is provided an ink composition. The composition comprises a metal compound and an ink vehicle. The metal compound includes at least one selected from a group consisting of a compound of formula I and a compound of formula II:

$$TiO_{2-\sigma} \quad (I),$$

$$M^1 M^2_p O_q \quad (II),$$

where, in the above formula I and formula II, $0.05 \leq \sigma < 1.8$, $M^1$ includes at least one element selected from a group consisting of groups 2, 9-12 of the periodic table according to IUPAC (International Union of Pure and Applied Chemistry) nomenclature, $M^2$ includes at least one element selected from a group consisting of groups 3-8, 10 and 13 of the periodic table according to IUPAC nomenclature, and $0 < p \leq 2$, and $0 < q < 4$.

According to a second aspect of the present disclosure, there is provided a method of metalizing a surface of an insulation substrate which comprises the steps of: applying an ink composition according to the present disclosure onto a surface to be metalized of the insulation substrate to obtain an insulation substrate with an ink layer; and plating at least one metal layer onto the insulation substrate with the ink layer.

According to a third aspect of the present disclosure, there is provided an article having a metallic surface, prepared according to the method of the present disclosure.

The ink composition according to the present disclosure may be applied to a surface to be metalized of an insulation substrate. Using the ink composition, electrical plating or chemical plating may be performed directly on the insulation substrate having the ink layer thereon, without presetting a chemical-plating catalyst in the substrate or subjecting the substrate to a laser etching prior to electric plating or chemical plating. The surface of the insulation substrate may be subjected to metalizing to form the signal transduction pathway. The method for metalizing surface of the insulation substrate according to the present disclosure has broad applications, which may be applied to the insulation substrates from various sources, and the process is simple.

In addition, compared with the commonly-used conductive precious metal (such as silver), the source of the conductive metal compound in the ink composition of the present disclosure is abroad with low price, which may significantly reduce the production cost of signal transduction component.

Additional aspects and advantages of embodiments of present disclosure will be given in part in the following descriptions, become apparent in part from the following descriptions, or be learned from the practice of the embodiments of the present disclosure.

DETAILED DESCRIPTION

According to a first aspect of the present disclosure, there is provided an ink composition. The composition may comprise a metal compound and an ink vehicle, and the metal compound may be at least one selected from a group consisting of a compound of formula I and a compound of formula II, $$TiO_{2-\sigma} \quad (I),$$

$$M^1 M^2_p O_q \quad (II),$$

where, in the above formula I or formula II, $0.05 \leq \sigma < 1.8$, $M^1$ may be at least one element selected from a group consisting of groups 2, 9-12 of the periodic table according to IUPAC nomenclature, $M^2$ may be at least one element selected from a group consisting of groups 3-8, 10 and 13 of the periodic table according to IUPAC nomenclature, and $0 < p \leq 2$, and $0 < q < 4$. (For example in one example of the present disclosure, q may be 1-3.98).

In one embodiment of the present disclosure, $\sigma$ may be about 0.05-1.5. Preferably, $\sigma$ may be about 0.05-1.2. More preferably, $\sigma$ may be about 0.3-1.2.

In one embodiment of the present disclosure, the present disclosure, an average particle of the metal compound may be properly selected in accordance with specific application situation. Preferably, the metal compound may have an average particle size of about 1 nm to 1 micron. The inventor of the present disclosure has found out that, when applying the ink composition onto an insulation substrate by means of ink-jet printing or laser printing, the metal compound may preferably has an average particle size of about 1-100 nm. According to the ink composition of the present disclosure, it may adopt various methods commonly-used in the art to make the average particle size of the metal compound within the above recited range. For example, it may adopt a grinding method to make the average particle size of the metal compound within the above recited range.

In a preferred embodiment of the present disclosure, the compound of formula I may have an average particle size of about 1-100 nm. And in one embodiment of the present disclosure, based on the total volume of the compound of formula I, about 50 to 100 volume % of the compound of formula I has a particle size of about 1 to 50 nm, when forming a metal layer on the insulation substrate with the ink composition containing the compound of formula I, the plating speed may be higher, and the formed metal layer may have a stronger adhesion force to the substrate.

In the present disclosure, unless otherwise stated, the average particle size may be measured by using a static laser tester, and the average particle size may be volume average particle size.

In one embodiment of the present disclosure, the compound of formula I may be commercially available. For example, it may be titanium black commercially available from Korea Bo Kwang Chemical Company under a trademark of Tilox.

In one embodiment of the present disclosure, the compound of formula I may be prepared by using any conventional method of related art. For example, a titanium dioxide may be calcinated in a reducing atmosphere to obtain the compound of formula I. Temperature and time of the calcination may be properly selected in accordance with a value in formula I. Generally, the temperature of the calcination may be about 730-830° C., the time of the calcination may be about 2.5-8 hours. The reducing atmosphere may be a commonly-used reducing atmosphere in the art, such as an atmosphere forming by ammonia gas. When using the atmosphere forming by ammonia gas, the ammonia gas may be preferably continuously charged into a container containing the compound of formula I, and flow velocity of the ammonia may be conventionally selected, such as the flow velocity may be about 2-6 cm³/s.

In one embodiment of the present disclosure, specific examples of $M^1$ may be but not limited to at least one of Mg, Ca, Sr, Ba, Co, Ni, Cu and Zn, and specific examples of $M^2$ may be but not limited to at least one of Sc, Y, Ti, Zr, Hf, V, Nb, Ta, Cr, Mo, W, Mn, Fe, Ru, B, Al, Ga and In.

In one embodiment of the present disclosure, $M^1$ is one element selected from a group consisting of group 11 of the periodic table according to IUPAC nomenclature, such as $M^1$ may be Cu; $M^2$ is one element selected from a group consisting of group 8 of the periodic table according to IUPAC nomenclature, such as $M^2$ may be Fe or Ru.

In one embodiment of the present disclosure, the metal compound is at least one selected from a compound of formula III, $$CuFeO_{4-\delta} \quad\quad (III),$$

where, in the above formula III, $0<\delta\leq 3$, preferably $\delta$ may be about 0.01-2, more preferably, $\delta$ may be about 0.02-1.

In one embodiment of the present disclosure, $M^1$ is one element selected from a group consisting of group 11 of the periodic table according to IUPAC nomenclature, such as $M^1$ may be Cu; and $M^2$ may comprise $M^{21}$ and $M^{22}$, $M^{21}$ is one element selected from a group consisting of group 8 of the periodic table according to IUPAC nomenclature, such as $M^{21}$ may be Fe or Ru, $M^{22}$ is at least one element selected from a group consisting of groups 13 and 7 of the periodic table according to IUPAC nomenclature, such as $M^{22}$ may be at least one selected from Mn, Al, B, Ga, and In. In one embodiment of the present disclosure, the molar ratio between $M^1$ and $M^2$ may be about 1:1, and the molar ratio between $M^{21}$ and $M^{22}$ may be about 1:0.1-10. Preferably the molar ratio between $M^{21}$ and $M^{22}$ may be 1:0.5-5, more preferably the molar ratio between $M^{21}$ and $M^{22}$ may be 1:0.5-3, and further preferably the molar ratio between $M^{21}$ and $M^{22}$ may be 1:1-3.

In one embodiment of the present disclosure, $M^{22}$ may be one element selected from a group consisting of group 13 of the periodic table according to IUPAC nomenclature (for example $M^{22}$ may be B, Al, Ga, or In); $M^{22}$ may also be one element selected from a group consisting of group 7 of the periodic table according to IUPAC nomenclature (for example $M^{22}$ may be Mn); and $M^{22}$ may also be one element selected from a group consisting of group 13 and one element selected from a group consisting of group 7 of the periodic table according to IUPAC nomenclature (for example $M^{22}$ may be Al and Mn). In one embodiment of the present disclosure, $M^{22}$ comprises $M^{221}$ and $M^{222}$, and $M^{221}$ is one element selected from a group consisting of group 13 of the periodic table according to IUPAC nomenclature, $M^{222}$ is one element selected from a group consisting of group 7 of the periodic table according to IUPAC nomenclature, and the molar ratio between $M^{221}$ and $M^{222}$ may be about 1:0.1-10, preferably may be 1:0.5-2. In one embodiment of the present disclosure, $M^{22}$ preferably may be one element selected from a group consisting of group 7 of the periodic table according to IUPAC nomenclature (for example $M^{22}$ may be Mn), when forming the ink layer on the substrate using the ink composition prepared by the metal compound, and further plating the metal on the surface of the ink layer, and a higher plating velocity may be obtained.

In one embodiment of the present disclosure, the metal compound preferably contains at least one selected from $CuFe_{0.5}Mn_{0.5}O_{2.5}$, $CuFe_{0.5}Al_{0.5}O_{2.5}$, and $CuFe_{0.5}Al_{0.25}Mn_{0.5}O_{2.5}$, more preferably contains $CuFe_{0.5}Mn_{0.5}O_{2.5}$.

In one embodiment of the present disclosure, $M^1$ is one element selected from a group consisting of group 2 of the periodic table according to IUPAC nomenclature, for example $M^1$ may be Mg, Ga, Sr, or Ba; and $M^2$ is one element selected from a group consisting of group 13 of the periodic table according to IUPAC nomenclature, for example $M^2$ may be B, Al, Ga, or In.

In one embodiment of the present disclosure, the metal compound preferably contains at least one selected from a compound of formula IV, $$MgGa_2O_{4-\lambda} \quad\quad (IV),$$

where, in the above formula IV, $0<\lambda\leq 3$, $\lambda$ preferably is 0.01-2, more preferably is 0.1-1, and further preferably is 0.1-0.5.

In one embodiment of the present disclosure, $M^1$ is one element selected from a group consisting of group 10 of the periodic table according to IUPAC nomenclature, for example $M^1$ may be Ni; and $M^2$ is one element selected from a group consisting of group 6 of the periodic table according to IUPAC nomenclature, for example $M^2$ may be Cr, Mo, or W.

In one embodiment of the present disclosure, the metal compound preferably contains at least one selected from a compound of formula V,

$$NiMoO_{4-\mu} \quad (V),$$

where, in the above formula V, $0<\mu\leq3$, preferably $\mu$ is 0.01-2, more preferably is 0.1-1, and further preferably is 0.2-0.5.

In one embodiment of the present disclosure, $M^1$ is one element selected from a group consisting of group 11 of the periodic table according to IUPAC nomenclature, for example $M^1$ may be Cu; and $M^2$ is at least one element selected from a group consisting of group 13 of the periodic table according to IUPAC nomenclature, $M^2$ comprises at least one element selected from a group consisting of group 13 of the periodic table according to IUPAC nomenclature and at least one element selected from a group consisting of groups 8 and 10 of the periodic table according to IUPAC nomenclature. In a preferred embodiment, the molar ratio between $M^1$ and $M^2$ preferably is 1:0.5-1.

In one embodiment of the present disclosure, $M^2$ comprises $M^{23}$ and $M^{24}$, $M^{23}$ is one element selected from a group consisting of groups 8, 10 and 13 of the periodic table according to IUPAC nomenclature. For example $M^{23}$ may be Ga, or Ga and at least one element selected from Fe and Ni; $M^{24}$ is one element selected from a group consisting of group 13 of the periodic table according to IUPAC nomenclature, and preferably is B. In this preferred embodiment, when both $M^{23}$ and $M^{24}$ are one element selected from a group consisting of group 13 of the periodic table according to IUPAC nomenclature, $M^{23}$ and $M^{24}$ are different elements; the molar ratio between $M^{23}$ and $M^{24}$ may be 1:0.1-10, preferably is 1:0.5-2, more preferably is 0.5-1.5, and further preferably is 1:1.

In one embodiment of the present disclosure, the metal compound preferably contains at least one selected from $CuFe_{0.5}B_{0.5}O_{2.5}$, $CuNi_{0.5}B_{0.5}O_{2.5}$, $CuGa_{0.5}B_{0.5}O_{2.5}$ and $CuB_{0.7}O_2$.

In one embodiment of the present disclosure, the metal compound contains a compound of formula VI,

$$Ca_\alpha Cu_{1-\alpha}TiO_{3-\beta} \quad (VI),$$

where, in the above formula VI, $0\leq\alpha<1$ and $\beta$ is about 0-2, preferably $\alpha$ is 0.05-0.5, more preferably $\alpha$ is 0.1-0.25; preferably $\beta$ is 0.01-2, more preferably $\beta$ is 0.01-0.5, and further preferably $\beta$ is 0.05-0.4.

In one embodiment of the present disclosure, the metal compound defined above may be used alone or may be used in combination, and there is no special restriction. For example, the metal compound may be at least one selected from the compound of above formula III, $CuFe_{0.5}Mn_{0.5}O_{2.5}$, $CuFe_{0.5}Al_{0.5}O_{2.5}$, $CuFe_{0.5}Al_{0.25}Mn_{0.5}O_{2.5}$, the compound of above formula IV, the compound of above formula V, $CuFe_{0.5}B_{0.5}O_{2.5}$, $CuNi_{0.5}B_{0.5}O_{2.5}$, $CuGa_{0.5}B_{0.5}O_{2.5}$, $CuB_{0.7}O_2$, and the compound of above formula VI.

Although the objectives of the present disclosure may be achieved by using the above metal compounds, the inventor of the present disclosure has found out that, when the metal compound of the formula I of the ink composition is at least one selected from following compounds, forming the ink layer on the substrate surface by using the ink composition containing the metal compound and subsequently plating the metal layer, it may obtain a higher plating velocity (especially by using electronic plating method):

(1) The compound of formula II, in which $M^1$ is one element selected from a group consisting of group 11 of the periodic table according to IUPAC nomenclature, and $M^2$ is one element selected from a group consisting of group 8 of the periodic table according to IUPAC nomenclature;

(2) The compound of formula II, in which $M^1$ is one element selected from a group consisting of group 11 of the periodic table according to IUPAC nomenclature; $M^2$ comprises $M^{21}$ and $M^{22}$, $M^{21}$ is one element selected from a group consisting of group 8 of the periodic table according to IUPAC nomenclature, and $M^{22}$ is at least one element selected from a group consisting of groups 13 and 7 of the periodic table according to IUPAC nomenclature (preferably $M^{22}$ is one element selected from a group consisting of group 7 of the periodic table according to IUPAC nomenclature); and (3) The compound of formula II, in which $M^1$ is one element selected from a group consisting of group 11 of the periodic table according to IUPAC nomenclature, $M^2$ is at least one element selected from a group consisting of group 13 of the periodic table according to IUPAC nomenclature, $M^2$ comprises at least one element selected from a group consisting of group 13 of the periodic table according to IUPAC nomenclature and at least one element selected from a group consisting of groups 8 and 10 of the periodic table according to IUPAC nomenclature; and (4) The compound of formula VI (eg. $Ca_\alpha Cu_{1-\alpha}TiO_{3-\beta}$).

To further improve the plating velocity, the metal compound may be at least one selected from the following compounds:

(1) The compound of formula II, in which $M^1$ is one element selected from a group consisting of group 11 of the periodic table according to IUPAC nomenclature, and $M^2$ is one element selected from a group consisting of group 8 of the periodic table according to IUPAC nomenclature;

(2) The compound of formula II, in which $M^1$ is one element selected from a group consisting of group 11 of the periodic table according to IUPAC nomenclature; $M^2$ comprises $M^{21}$ and $M^{22}$, $M^{21}$ is one element selected from a group consisting of group 8 of the periodic table according to IUPAC nomenclature, $M^{22}$ is at least one element selected from a group consisting of group 7 of the periodic table according to IUPAC nomenclature; and (3) The compound of formula VI (eg. $Ca_\alpha Cu_{1-\alpha}TiO_{3-\beta}$).

More preferably, the metal compound is at least one selected from the following compounds:

(1) The compound of formula II, in which $M^1$ is one element selected from a group consisting of group 11 of the periodic table according to IUPAC nomenclature, and $M^2$ is one element selected from a group consisting of group 8 of the periodic table according to IUPAC nomenclature; and (2) The compound of formula VI (eg. $Ca_\alpha Cu_{1-\alpha}TiO_{3-\beta}$).

Further preferably, the metal compound is at least one selected from the compound of the formula III (eg. $CuFeO_{4-\delta}$), which may obtain improved higher plating velocity.

In addition, the inventor of the present disclosure has found out that, when the metal compound of the ink composition is at least one selected from the following compounds, the signal pathway, formed through forming the ink layer on the substrate surface by using the ink composition, and plating the metal layer, may have a higher signal sensitivity: (1) the compound of formula IV; (2) the compound of formula V in which, $M^1$ is one element selected from a group consisting of group 10 of the periodic table according to IUPAC nomenclature, and $M^2$ is one element selected from a group consisting of group 6 of the periodic table according to IUPAC nomenclature; (3) the compound of formula VI ($Ca_aCu_{1-\alpha}TiO_{3-\beta}$).

In one embodiment of the present disclosure, further preferably the metal compound is at least one selected from the compound of formula VI, thus it may not only obtain higher plating velocity, but also obtain higher signal sensitivity.

In one embodiment of the present disclosure, the compound of formula II may be commercially available, and also may be prepared by using a conventional method in the art.

In one embodiment of the present disclosure, a preparing method of the metal compound may comprise the steps of:
evenly mixing $M^1$ oxide or $M^1$ carbonate (in $M^1$ oxide, the molar ration between $M^1$ and $$O \text{ is } \frac{2}{m^1} : 1,$$

$M^1$ is the valence of $M^1$) and $M^2$ oxide (in $M^2$ oxide, the molar ration between $M^1$ and $$O \text{ is } \frac{2}{m^2} : 1,$$

$M^2$ is the valence of $M^2$) to form a mixture; and calcinating the resulting mixture in a non-reactive atmosphere or a reducing atmosphere to obtain the metal compound (eg. $M^1M^2_pO_q$). The amounts of $M^1$ oxide or $M^1$ carbonate and $M^2$ oxide are properly selected to make the molar ratio between $M^1$ and $M^2$ being 1:p in the obtained first metal compound.

For example, for the compound of formula III, the compound may be obtained by the steps of:
mixing copper oxide and iron oxide to form a mixture; and
subjecting the resulting mixture to calcination in a non-reactive atmosphere and a reducing atmosphere to obtain the compound of formula III (eg. $CuFeO_{4-\delta}$).

For compound of formula IV, the compound may be obtained by the steps of: mixing magnesium oxide and gallium oxide evenly to form a mixture; and subjecting the resulting mixture to calcination in the non-reactive atmosphere and the reducing atmosphere to obtain the compound of formula IV (eg. $MgGa_2O_{4-\lambda}$).

For the compound of formula V, the compound may be obtained by the steps of:
mixing nickel oxide and molybdenum oxide evenly to form a mixture; and
subjecting the resulting mixture to calcination in the non-reactive atmosphere and the reducing atmosphere to obtain the compound of formula V (eg. $NiMoO_{4-\mu}$).

For the compound of formula VI, the compound may be obtained by the steps of:
mixing calcium carbonate, copper oxide and titanium oxide evenly to form a mixture; and
subjecting the resulting mixture to calcination in the non-reactive atmosphere and the reducing atmosphere to obtain the compound of formula VI (eg. $Ca_\alpha Cu_{1-\alpha}TiO_{3-\beta}$).

In one embodiment of the present disclosure, the temperature of the calcination may be about 500 to 1000 degree s Celsius; the time of the calcination may be about 1 to 12 hours.

In one embodiment of the present disclosure, the non-reactive atmosphere refers to a gas which may not chemically interact with reactants and reaction products during the calcination process, for example: nitrogen and the gas of Group Zero (such as argon). In one embodiment of the present disclosure, the reducing atmosphere may be an atmosphere comprising of a mixture of hydrogen and non-reactive gas, in which the hydrogen concentration may be conventionally selected in the art.

In one embodiment of the present disclosure, the ink composition may also comprise an ink vehicle. When applying the ink composition onto the surface of the insulation substrate, the ink vehicle may play a role of making the metal compound dispersed on the insulation substrate surface evenly and forming a layer having a certain strength and a certain adhesion force to the insulation substrate.

The present disclosure has no special restriction to the type of the ink vehicle, as long as the ink vehicle selected may play the above roles. Preferably, the ink vehicle is organic binder. More preferably, the ink vehicle is at least one selected from a group consisting of cellulose acetate, polyacrylate-based resin, ethylene-vinyl acetate copolymer, polyvinyl alcohol, polyvinyl acetal, polyvinyl acetate, polyvinyl pyrrolidone, and polyphosphonic acid.

In one embodiment of the present disclosure, the ink vehicle may be commercially available from Eastman Company, USA, CAB Series cellulose aceto butyrate (for example: cellulose aceto butyrate under a trademark of CAB381-0.5, CAB381-20 of CAB551-0.2 and CAB381-2), or may be commercially available from Kuraray Co., Ltd., Japan, Mowital series polyvinyl butyral (for example: polyvinyl butyral under a trademark of Mowital B of 60T, Mowital B 75H and Mowital B 60H).

In one embodiment of the present disclosure, the relative ratio between the ink vehicle and the metal compound may make the metal compound being dispersed on the surface of the insulation substrate evenly, and form the ink layer having a certain strength and a certain adhesion force to the insulation substrate, and may plate the metal layer onto the ink layer. Generally, in the ink composition according to the present disclosure, based on 100 weight parts of the metal compound, the amount of the ink vehicle may be about 1-30 weight parts. Based on 100 weight parts of compound of formula I, the amount of the ink vehicle preferably is about 1.5 to 15 weight parts; and based on 100 weight parts of compound of formula II, the amount of the ink vehicle preferably is about 15 to 30 weigh parts.

In one embodiment of the present disclosure, to further improve the uniformity of the metal compound dispersing in the ink vehicle and to form more even film on the surface of the insulation substrate, the ink composition preferably also comprises a solvent. The ink composition of the present disclosure has no special restriction to the type of the solvent; it may be conventionally selected in the art. Preferably, the solvent is at least one selected from a group consisting of $H_2O$, $C_1$-$C_{12}$ alcohol, $C_3$-$C_{12}$ ketone, $C_6$-$C_{12}$ arene, $C_1$-$C_{12}$ alkyl halide, and $C_2$-$C_{12}$ olefin halide. Specifically, the solvent may be at least one selected from the group consisting of methanol, ethanol, n-propanol, isopropanol, n-butanol, tert-butanol, n-pentanol, n-hexanol, n-heptanol, n-octanol, acetone, 2-n-amyl ketone, 2-n-butanone, 3-methyl-2-pentanone, 2,3-butanedione, 2,3-pentanedione, 2,5-hexanedione, 1,3-cyclohexanedione, toluene, xylene and trichloroethylene.

According to embodiments of the present disclosure, there is no special restriction to the amount of solvent, and it may be any conventional usage amount in the art. To ensure that the metal compound can be dispersed in the ink vehicle evenly and formed into a layer of film on the insulation substrate surface, based on 100 weight parts of the metal compound, the content of the solvent is about 20 to 200 weight parts. Based on 100 weight parts of compound of formula I, the content of the solvent preferably is about 30 to 120 weight parts; based on 100 weight parts of the compound of formula II, the content of the solvent preferably is about 20 to 100 weight parts.

In one embodiment of the present disclosure, the ink composition may also contain various commonly-used auxiliary agents in accordance with specific application to give the ink composition of the present disclosure a specific performance or functionality. Preferably, the auxiliary agent contains at least one selected from a group of dispersant, defoamer, flatting agent and viscosity modifier.

The usage amount of the auxiliary agent may be a conventional selection in the art. Preferably, based on 100 weight parts of the metal compound, the total amount of the auxiliary agent may be about 0.1 to 20 weight parts, preferably is about 0.5-10 weight parts.

In one embodiment of the present disclosure, the dispersant is used to shorten time of dispersing the metal compound in the ink vehicle and optional solvent, and to improve the dispersion stability of the metal compound in the ink vehicle and optional solvent. The dispersant may be various commonly-used substances in the art which can achieve the above function. For example, the dispersant may be commonly-used organic dispersants in the art, such as aliphatic amine dispersant, alcohol amine dispersant, cyclic unsaturated amine dispersant, fatty acid dispersant, aliphatic amide dispersant, ester dispersant, paraffin dispersant, phosphate dispersant, polymeric dispersant (for example, acrylate dispersant and polyester dispersant) and organic phosphonic dispersant.

In one embodiment of the present disclosure, the dispersant may be various commercially available commonly-used dispersants in the art. Specifically, the dispersant may be at least one selected from a group consisting of: the dispersants commercially available from BYK Company, Germany under trademarks of ANTI-TERRA-U, ANTI-TERRA-U 80, ANTI-TERRA-U 100, DISPERBYK-101, DISPER-BYK-130, BYK-220 S, LACTIMON, LACTIMON-WS, BYK-W 966, DISPERBYK, BYK-154, BYK-9076, DISPERBYK-108, DISPERBYK-109, DISPERBYK-110, DISPERBYK-102, DISPERBYK-111, DISPERBYK-180, DISPERBYK-106, DISPERBYK-187, DISPERBYK-181, DISPERBYK-140, DISPERBYK-142, DISPERBYK-145, DISPERBYK-115, DISPERBYK-160, DISPERBYK-161, DISPERBYK-162, DISPERBYK-163, DISPERBYK-164, DISPERBYK-165, DISPERBYK-166, DISPERBYK-167, DISPERBYK-182, DISPERBYK-183, DISPERBYK-184, DISPERBYK-185, DISPERBYK-168, DISPERBYK-169, DISPERBYK-170, DISPERBYK-171, DISPERBYK-174, DISPERBYK-190, DISPERBYK-2150, BYK-9077, DISPERBYK-112, DISPERBYK-116, DISPERBYK-191, DISPERBYK-192, DISPERBYK-2000, DISPERBYK-2001, DISPERBYK-2010, DISPERBYK-2020, DISPERBYK-2025, DISPERBYK-2050 and DISPERBYK-2070; the dispersant commercially available from Holland Akzo Nobel Company under a trademark of PHOSPHLAN PS-26; the dispersant commercially available from Witco Chemical Company, USA under a trademark of PS-21A; the dispersants of the Hypermer KD series and Zephrym PD series which are commercially available from Croda Company, UK.

In one embodiment of the present disclosure, the usage amount of the dispersant may be a conventional usage amount in the art. Generally, based on 100 weight parts of the metal compound, the amount of the dispersant may be about 0.1 to 4 weight parts.

In one embodiment of the present disclosure, the defoamer may be various commonly-used substances in the art which can suppress the forming of foam; destroy formed foam or disengage the formed foam from the system. For example, the defoamer may be organic silicone defoamer, polyether defoamer and higher alcohol defoamer. Preferably, the defoamer is organic silicone defoamer.

In one embodiment of the present disclosure, the defoamer may be various commonly-used defoamers in the art which are commercially available. Specifically, the defoamer may be at least one selected from a group consisting of the deformers commercially available from BYK Company, Germany under trademarks of BYK-051, BYK-052, BYK-053, BYK-055, BYK-057, BYK-020, BYK-065, BYK-066N, BYK-067A, BYK-070, BYK-080A, BYK-088, BYK-141, BYK-019, BYK-021, BYK-022, BYK-023, BYK-024, BYK-025, BYK-028, BYK-011, BYK-031, BYK-032, BYK-033, BYK-034, BYK-035, BYK-036, BYK-037, BYK-038, BYK-045, BYK-A530, BYK-A555, BYK-071, BYK-060, BYK-018, BYK-044 and BYK-094.

In one embodiment of the present disclosure, the usage amount of the defoamer may be a conventional usage amount in the art. Preferably, based on 100 weight parts of the metal compound, the amount of the defoamer may be about 0.1 to 3 weight parts.

In one embodiment of the present disclosure, the flatting agent is used to promote the ink forming a more flat, smooth and uniform film layer during drying and film-forming process. The present disclosure has no special restriction to the type of the flatting agent; it may be a commonly-used substance in the art which can achieve the above function. For example, the flatting agent may be at least one selected from a group consisting of polyacrylate flatting agent, polydimethylsiloxane flatting agent, polymethylphenylsiloxane flatting agent and fluorine-containing surfactant.

In one embodiment of the present disclosure, the flatting agent may be various commonly-used flatting agents in the art which are commercially available. For example, the flatting agent may be at least one selected from a group consisting of the flatting agents commercially available from BYK Company, Germany under the trademarks of BYK-333, BYK-306, BYK-358N, BYK-310, BYK-354 and BYK-356.

In one embodiment of the present disclosure, the usage amount of the flatting agent may be a conventional usage amount, there is no special restriction. Preferably, based on 100 weight parts of the metal compound, the amount of the flatting agent is about 0.3 to 4 weight parts (for example it may be about 0.3 to 1 weight parts).

In one embodiment of the present disclosure, the viscosity modifier is used to adjust the viscosity of the ink composition. The present disclosure has no special restriction to the type of the viscosity modifier; it may be a conventional selection in the art. For example, the viscosity modifier may be at least one selected from a group consisting of gas silica, polyamide waxes, organic bentonite, hydrogenated castor oil, metallic soaps, hydroxyalkyl cellulose and derivatives thereof, polyvinyl alcohol and polyacrylates.

In one embodiment of the present disclosure, the usage amount may be conventionally selected in the art. Preferably, based on 100 weight parts of the metal compound, the amount of the viscosity modifier is about 0.3 to 3 weight parts (for example it may be about 0.3 to 1 weight parts).

In one embodiment of the present disclosure, the ink composition comprises the metal compound, the ink vehicle, the solvent, the deformer, the flatting agent and the viscosity modifier, which are defined above. Based on 100 weight parts of the metal compound, the amount of the ink vehicle is about 1 to 30 weight parts, the amount of the solvent is about 20 to 200 weight parts, the amount of the dispersant is about 0.4 to 4 weight parts, the amount of the defoamer is about 0.1 to 3 weight parts, the amount of the flatting agent is about 0.3 to 4 weight parts, the amount of the viscosity modifier is about 0.3 to 3 weight parts.

The preparation method for the ink composition according to the present disclosure is not specifically limited, as long as it may evenly mix the metal compound and the ink vehicle as well as optional solvent and auxiliary agent. For example, it may evenly mix the metal compound and the ink vehicle as well as optional solvent and auxiliary agent in a mixer (such as Star ball mill) to obtain the ink composition according to the present disclosure. The method and condition of evenly mixing in the mixer are known in the art, there is no need to repeat.

The ink composition according to the present disclosure may be applied to a surface of the insulation (eg. non-conductive) substrate, and it may be subjected to chemical plating or electronic plating on the surface of the insulation substrate to metalize the surface of the insulation substrate, and then a signal transduction pathway is formed on the surface of the non-conductive substrate.

In another aspect of the present disclosure, also is provided a method of metalizing a surface of an insulation substrate, which comprises the steps of: applying an ink composition according to the present disclosure onto a surface to be metalized of the insulation substrate to obtain an insulation substrate with an ink layer; and plating at least one metal layer onto the insulation substrate with the ink layer.

According to the embodiments of the present disclosure, it may adopt various commonly-used methods in the art to apply the ink composition of the present disclosure onto the surface of the insulation substrate, for example, it may apply the ink formed according to the ink composition of the present disclosure onto the surface to be metalized of the insulation substrate by using at least one method selected from the group consisting of screen printing, spraying, laser printing, inkjet printing, transfer printing, gravure, letterpress printing and lithograph, there is no need to repeat.

In one embodiment of the present disclosure, the method may also comprise: applying the ink composition onto the surface of the insulation substrate, subjecting the substrate having the ink composition to drying. The method for drying of the present disclosure has no special restriction, and it may be appropriately selected according to the ink vehicle in the ink composition and the type of the optional solvent. For examples, the temperature of the drying may be about 40 to 150 degrees Celsius, and the time may be about 0.5 to 5 hours. The drying may be carried out under atmospheric pressure, or may also be carried out under reduced pressure.

In one embodiment of the present disclosure, the thickness of the ink layer may be appropriately selected according to the constituent of the ink composition, as long as electronic plating or chemical plating may be performed on the surface of the insulation substrate, and then the metalizing of the insulation substrate surface is obtained. Preferably, the ink layer may have a thickness of about 8 to 50 microns. More preferably, the ink layer may have a thickness of about 12 to 40 microns. More preferably, the ink layer may have a thickness of about 12 to 25 microns.

In one embodiment of the present disclosure, the method also comprises: plating at least one metal layer onto the insulation substrate with the ink layer by using electronic plating or chemical plating. The ink layer formed on the surface of the insulation substrate with the ink composition provided by the present disclosure may have electrical conductivity. It may perform chemical plating or electronic plating directly on the surface of the insulation substrate. The surface having no ink layer of the insulation substrate will not be metalized during the process of chemical plating or electronic plating.

In one embodiment of the present disclosure, the method of chemical plating or electronic plating on the ink layer of the substrate surface has no special restriction, and it may be conventionally selected in the art.

In one embodiment of the present disclosure, in accordance with the specific operating requirement, the chemical plating or electronic plating may be performed on the ink layer of the substrate surface at least once, so as to form at least one layer of the metal layer on the substrate surface. In one embodiment of the present disclosure, when chemical plating or electronic plating at least one on the substrate to form multi-layer of the metal layer on the substrate surface, the constituent and the thickness of each metal layer may be appropriately selected according to the specific operation requirement, and the metal in each metal layer may be same or different.

Preferably, the metal layer may comprise at least two layers. In one embodiment, a Cu layer is formed on the substrate surface, and a Ni layer is formed on the outer surface of the Cu layer. In one embodiment, a Cu layer is formed on the substrate surface, and a Ni layer is formed on the outer surface of the Cu layer. In one embodiment, a first Ni layer is formed on the substrate surface, a Cu layer is formed on the outer surface of the first Ni layer, and a second Ni layer is formed on the outer surface of the Cu layer. In one embodiment, a first Ni layer is formed on the substrate surface, a Cu layer is formed on the outer surface of the first Ni layer, a second Ni layer is formed on the outer surface of the Cu layer, and an Au layer is formed on the outer surface of the second Ni layer. In one embodiment, a Cu layer is formed on the substrate surface, a Ni layer is formed on the outer surface of the Cu layer, and an Ag layer is formed on the outer surface of the Ni layer. The method according to the present disclosure has no special restriction to the thickness of each metal layer, as long as it may be able to meet the requirements. Generally, the thickness of the Ni layer may be about 3 to 4 microns, the thickness of the Cu layer may be about 10 to 60 microns, and the thickness of the Au layer may be about 0.02 to 0.08 microns.

The method of the present disclosure may metalize various insulation substrates, and the insulation substrate, for example, may be plastic substrate, rubber substrate, fibrous substrate, coating layer formed by coating, ceramic substrate, glass substrate, wood substrate, cement substrate or paper. Preferably, the insulation substrate may be plastic substrate or ceramic substrate. When the insulation substrate is made from a flexible plastic (such as polyethylene-glycol-terephthalate, polyimide, polycarbonate, polyether-ketone, polyether-ether-ketone or liquid-crystal-polymer), the ink composition of the present disclosure may be applied onto the substrate surface, and the article obtainable by metalizing the substrate is particularly suitable for preparing a flexible circuit board.

In one embodiment of the present disclosure, the insulation substrate may be glass substrate, ceramic substrate or cement substrate (preferably is ceramic substrate). The method may also further comprise subjecting the insulation substrate with the ink layer to heat treatment at a temperature of about 500 to 1000 degrees Celsius in a non-reactive atmosphere, prior to the step of plating. This may further improve the adhesion force (eg. bonding force) of the metal layer formed by the method of the present disclosure to the substrate. To further improve the adhesion force of the metal layer to the substrate, the temperature of heat treatment is about 700 to 900 degrees Celsius. The present disclosure has no special restriction to the time of the heat treatment, as long as it may ensure to improve the adhesion force of the metal layer finally formed to the substrate. Preferably, the time of the heat treatment is about 1 to 5 hours. In one embodiment of the present disclosure, the non-reactive atmosphere refers to an atmosphere forming by chemical inert gas, such as a nitrogen atmosphere, an atmosphere forming by Group Zero gas (such as Ar).

In one embodiment of the present disclosure, to further improve the adhesion force of the metal layer finally formed to the substrate, applying the ink composition onto the surface to be metalized of the insulation substrate may include: mixing the ink composition with an inorganic binder to form a mixture; and applying the mixture onto the surface to be metalized. Based on 100 weight parts of the ink composition, the amount of the inorganic binder is about 1 to 15 weight parts. Preferably, based on 100 weight parts of the ink composition, the amount of the inorganic binder is about 5 to 15 weight parts; more preferably, based on 100 weight parts of the ink composition, the amount of the inorganic binder is about 5 to 10 weight parts.

The method according to the present disclosure has no special restriction to the type of the inorganic binder; it may be various commonly-used inorganic binders in the art. Preferably, the inorganic binder is at least one selected from a group consisting of $SiO_2$, $CaO$, $Na_2O$, $ZnO$ and $Ni_2O_3$.

In another preferred embodiment of the present disclosure, the substrate is polymer substrate or paper substrates, the ways of applying the ink composition onto the surface to be metalized of the insulation substrate to form the ink layer comprises: mixing the ink composition with an epoxy resin binder to form a mixture; applying the mixture onto the surface to be metalized; and curing the ink composition on the surface at a temperature of about 60 to 150 degrees Celsius. Based on 100 weight parts of the composition, the amount of the epoxy resin binder is about 5 to 10 weight parts. This may further improve the adhesion force of the metal layer finally formed to the substrate.

In one embodiment of the present disclosure, the epoxy resin binder contains an epoxy resin and a curing agent for curing the epoxy resin.

In one embodiment of the present disclosure, the method has no special restriction to the epoxide value of the epoxy resin; and it may be a conventional selection in the art. Preferably, the epoxide value of the epoxy resin is about 0.5 to 0.9 mol/100 g. The present disclosure has no special restriction to the type of the epoxy resin, and it may be various commonly-used epoxy resins in the art. For example, it may be aromatic epoxy resin, aliphatic epoxy resin and alicyclic epoxy resin. Particularly, the epoxy resin may be at least one selected from a group consisting of bisphenol A-type epoxy resin, bisphenol F-type epoxy resin, tetraphenols ethane epoxy resin, N,N,N',N'-four epoxy propyl-4,4'-diaminodiphenylmethane, 4-(2,3-epoxypropoxy)-N,N-di(2,3-epoxy propyl) aniline, 3,4-epoxy cyclohexyl methyl-3,4-epoxycyclohexyl carboxylic acid ester, 4-vinyl-1-cyclohexene diepoxide, dicyclopentadiene epoxide, pentaerythritol diglycidyl ether, 1,4-butanediol diglycidyl ether, 1,6-ring hexanediol diglycidyl ether, tetrahydrophthalic acid diglycidyl ester, hexahydrophthalic acid diglycidyl ester, 4,5-epoxytetrahydrophthalic acid diglycidyl ester, 1,2-epoxyhexadecane, n-butyl glycidyl ether, ethylene glycol diglycidyl ether, 1,6-hexanediol diglycidyl ether, polyethylene glycol diglycidyl ether, 1,4-butanedioldiglycidyl ether, trimethylolpropane triglycidyl ether, neopentyl glycol diglycidyl ether, allyl glycidyl ether, and glycerol diglycidyl ether.

The method according to the present disclosure has no special restriction to the type of the curing agent, and it may be various commonly-used an amine curing agent and/or an anhydride curing agent which may make the epoxy resin taking a crosslinking reaction. For example, the curing agent may be at least one selected from a group consisting of phthalic anhydride, trimellitic anhydride, pyromellitic dianhydride, benzophenone tetracarboxylic acid dianhydride, maleic anhydride, tung anhydride, olefinic succinic anhydride, tetrahydrophthalic anhydride, hexahydrophthalic anhydride, methyl-tetrahydro-phthalic anhydride, methyl-hexahydrophthalic anhydride, nadic anhydride (i.e., a norbornene anhydride), hydrogenated nadic anhydride, methyl nadic anhydride, glutaric anhydride, terpene anhydride, methyl ring hexene tetracarboxylicdianhydride, dodecenyl succinic anhydride, polyazelaic anhydride, poly sebacic anhydride, tetrabromophthalic anhydride, tetrachlorophthalic anhydride, trimellitic anhydride, ethylene glycol esters, the trimellitic anhydride glycerides, diphenylsulfonetetracarboxylic acid dianhydride, ethylenediamine, diethylene triamine, diamino diphenyl sulfone, diamino diphenyl methane, m-phenylenediamine, dicyandiamide, a polyether amine, diethylenetriamine, hexyldiamine, trimethyl hexamethylene diamine, and tetraethylene pentamine.

According to the present disclosure, the usage amount of the curing agent may be appropriately selected in accordance with the type and the epoxide value of the epoxy resin. For example, when the curing agent is the amine curing agent, it may determine a theoretical usage amount of the curing agent by following formula (based on 100 weight parts of the epoxy resin):

Usage amount of the amine curing agent=(amine equivalent/epoxy equivalent)×100 amine equivalent=molecular weight of the amine curing agent/active hydrogen of the amine.

When the curing agent is the anhydride curing agent, it may determine a theoretical usage amount of the curing agent by following formula (based on 100 weight parts of the epoxy resin):

$$\text{usage amount of the curing agent} = \frac{K \times M \times E}{N}$$

where,

M is relative molecular mass of curing agent, in a term of g/mol;

N is the number of anhydride units in one curing agent molecule;

E is epoxide value, in a form of mol/100 g;

K is empirical coefficient, when an accelerator is not used, K is 0.6 for chlorine-containing anhydride, K is 0.85 for rest anhydrides; and K is 1.0 when tertiary amine is used as the accelerator; K is 0.8 when tertiary amine and M $(BF_4)_n$ are used as the accelerator.

Normally, the actual usage amount of the curing agent may be about 0.9 to 1.2 times of the theoretical amount.

According to the present disclosure, the epoxy resin binder may also contain curing accelerator, the curing accelerator may be various commonly-used curing accelerators in the art, which are not specially limited in present disclosure. For example, the curing accelerator may be at least one selected from a group consisting of TBZ accelerators commercially available from Shikoku, Japan under trademarks of 2MZ, C11Z, C17Z, 1.2DMZ, 2E4MZ, 2PZ, 2P4MZ, 1B2MZ, 1B2PZ, 2MZ-CN, C11Z-CN, C11Z-CNS, 2E4MZ-CN, 2PZ-CN, 2PZCNS-PW, 2MZ-A, C11Z-A, 2E4MZ-A, AMA-OK, 2PZ-OK, 2PHZ-PW, 2P4MHZ-PW and P-0505. The usage amount of the curing accelerator is known in the art, there is no need to repeat.

The present disclosure has no special restriction to the curing time, which may be a conventional selection in the art, for example, the curing time may be about 1 to 5 hours.

The present disclosure also provides an article having a metalizing surface prepared according to the method of the present disclosure. It should be noted that the features and advantages described above for the ink composition or method will also apply to the article.

The invention will be further described below in way of example. Raw materials used in Examples and Comparative Examples are all commercially available.

In the following examples, the composition of the metal compound is measured by a photoelectron spectroscopy method (XPS).

In the following examples, the particle size of the metal compound is measured using laser particle size tester commercially available from Chengdu fine new Powder Testing Equipment Co. Ltd.

In the following examples, the thickness of the ink layer is measured using a scanning electron microscopy (SEM).

In the following examples, the adhesion force of the metal layer formed on the substrate surface is measured by means of a Cross-Cut Tape Test. Specifically, the Cross-Cut Tape Test comprises: cutting a lattice pattern of 10×10 squares with 1 mm×1 mm of each square using a Cross-cutter on the surface of test sample, in which each cut shall penetrate to the bottom layer of the metal layer; cleaning the test sample using a brush to remove debris from the test area; adhering a tape (3M No. 600 tape) over the lattice pattern; removing the tape by grasping a free end and pulling it off quciking in a vertical direction. Repeat the same test twice at a same site, and the adhesion force grade is determined according to the following standards:

5B: The edges of the cuts are smooth, and none of the squares of the lattices is detached;

4B: Detachment of small flakes at the intersections of the lattices, and the detached area is less than 5%;

3B: Detachment of small flakes at the intersections and edges of the lattices, and the detached area is between 5-15%;

3B: Detachment of large flakes at the intersections and edges of the lattices, and the detached area is between 5-15%;

2B: Detachment of large flakes at the intersections and edges of the lattices, and the detached area is between 15-35%;

1B: Detachment of large flakes at the intersections and edges of the lattices, and the detached area is between 35-65%; and 0B: Detachment of large flakes at the intersections and edges of the lattices, and the detached area is greater than 65%.

In the following examples, Total Isotropic Sensitivity (TIS) is measured using the method specified in YD/T 1484-2006, in which GSM1800 system is applied, and the surface of the substrate is metalized to form a pattern as an antenna of a receiver. The measurement is performed under a mode of antenna unplugged in a free space, and the frequency of measurement is 2112 MHz. Results of measurement are reported in term of dBm, and the larger its absolute value, the higher the sensitivity of signal.

Examples 1-12 are used for illustrating the ink composition and the application thereof as well as the article with metalized surface and preparing method thereof according to the present disclosure.

Example 1

(1) Titanium dioxide (commercially available from Aladdin Reagent Company having an average particle size of about 60 nm) was loaded in the middle of a porcelain boat; the boat was placed into a reaction tube which was then placed at a high temperature section of a muffle furnace. Both ends of the reaction tube were tightly sealed with a rubber plug and were cooled with dripping water, an atmosphere of ammonia gas was charged into the tube to replace the air whinthin the tube. At the same time, a pH test paper was used to check the sealing condition of the reaction apparatus, and in the case of no ammonia leakage, the power was turned on, and the ammonia flow rate was controlled at 4 $cm^3$/s. The temperature of the muffle furnace was raised to 780 degrees Celsius which was maintained for 4 hours, and then the boat was cooled down to 100 degrees Celsius under the ammonia gas atmosphere. After turning off the ammonia gas, the boat was taken out and placed in a desiccator to cool down to room temperature, and then a compound of formula I was obtained. The prepared titanium oxide was grinded to an average particle size of about 40 mm by high-speed ball mill, and the total volume of the titanium oxide was taken as a standard; about 80 volume % of the titanium oxide had a particle size of about 1 to 50 nm. After being measured, the obtained titanium oxide was determined as $TiO_{1.67}$.

(2) 100 g titanium oxide prepared in step (1), 20 g ink vehicle (commercially available from Eastman Chemical Company under a trademark of CAB381-0.5), 100 g n-heptanol, 2 g dispersant (commercially available from BYK Company, Germany under a trademark of DISPERBYK-165), 0.2 g defoamer (commercially available from BYK Company, Germany under a trademark of BYK-051), 0.4 g flatting agent (commercially available from BYK Company, Germany under a trademark of BYK-333) and 0.5 g hydrogenated castor oil (commercially available from Wuhan JINNUO Chemical Co., Ltd.) were evenly mixed to obtain the ink composition of the present example.

(3) The ink composition was applied onto a surface of a polyimide substrate by spraying, and was then dried for about 2 hours at a temperature of 100 degrees Celsius, thereby an ink layer was formed on the substrate surface, and the ink layer had a thickness of about 15 μm.

(4) The substrate having the ink layer prepared in step (3) was placed in a plating solution to perform chemical plating. The compositions of the plating solution were: 0.12 mol/L $CuSO_4.5H_2O$, 0.14 mol/L $Na_2EDTA.2H_2O$, 10 mg/L potassium ferrocyanide, 10 mg/L 2,2'-bipyridine, 0.10 mol/L glyoxylic acid. The plating solution was adjusted to a pH of 12.5-13 by using solutions of NaOH and $H_2SO_4$, and the temperature of the plating solution was 50 degrees Celsius.

After being measured, the plate layer had a thickness of about 20 μm, the plating rate was 3.0 μm/h, and the adhesion force of the metal layer formed on the substrate surface was 3B.

Example 2

The ink composition was prepared and the substrate was metalized by a method which is substantially the same as the method in Example 1, with the following exceptions: in step (3), after mixing the ink composition prepared in step (2) with an epoxy resin binder to form a mixture, applying the mixture onto the surface of the polyimide substrate by spraying, and then dried for about 2 hours at the temperature of 100 degrees Celsius, then curing the ink composition on the surface for about 1.5 hours at a temperature of 120 degrees Celsius, and for the epoxy resin binder, the epoxy resin was a bisphenol A-type epoxy resin having an epoxide value of about 0.58 mol/100 g; the curing agent was phthalic anhydride; based on 100 weight parts of the ink composition obtained in step (2), the usage amount of the epoxy resin was 10 g, and the usage amount of the curing agent was 7.2 g.

After being measured, the plate layer had a thickness of about 20 μm, the plating rate was 3.1 m/h, and the adhesion force of the metal layer formed on the substrate surface was 4B.

Example 3

(1) Titanium dioxide (commercially available from Aladdin Reagent Company having an average particle size of about 60 nm) was loaded in the middle of a porcelain boat; the boat was placed into a reaction tube which was then placed at a high temperature section of a muffle furnace. Both ends of the reaction tube were tightly sealed with a rubber plug and were cooled with dripping water, and an atmosphere of ammonia gas was charged into the tube to replace the air within the tube. At the same time a pH test paper was used to check the sealing condition of the reaction apparatus. And in the case of no ammonia leakage the power was turned on, the ammonia flow rate was controlled at 2 $cm^3/s$. The temperature of the muffle furnace was raised to 800 degrees Celsius which was maintained for 3 hours, and then the boat was cooled down to 80 degrees Celsius under the ammonia gas atmosphere. After turning off the ammonia gas, the boat was taken out and placed in a desiccator to cool down to room temperature, then a compound of formula I was obtained. The prepared titanium oxide was grinded to an average particle size of about 50 mm by high-speed ball mill, and the total volume of the titanium oxide was taken as a standard; about 90 volume % of the titanium oxide had a particle size of about 1 to 50 nm. After being measured, the obtained titanium oxide was determined as $TiO_{1.95}$.

(2) 100 g titanium oxide prepared in step (1), 30 g ink vehicle (commercially available from Japan's Mitsui Chemicals, Inc. under a trademark of EVA 210), 110 g toluene, 3 g dispersant (commercially available from BYK Company, Germany under a trademark of ANTI-TERRA-U 80), 0.5 g defoamer (commercially available from BYK Company, Germany under a trademark of BYK-065), 0.5 g flatting agent (commercially available from BYK Company, Germany under a trademark of BYK-306) and 0.4 g hydroxyethyl cellulose (commercially available from Luzhou North Fangda Dong Chemical Company) were evenly mixed to obtain the ink composition of the present example.

(3) The ink composition was applied to a surface of a polycarbonate substrate by means of a transfer-print method, and was then dried for about 4 hours at a temperature of 80 degrees Celsius, and thereby an ink layer was formed on the substrate surface, and the ink layer had a thickness of 35 μm.

(4) The substrate having the surface with ink layer was subjected to electronic plating to form a copper plate layer, and the current intensity was 3 $A/cm^2$.

After being measured, the plate layer had a thickness of about 20 μm, the plating rate was 92 m/h, and the adhesion force of the metal layer formed on the substrate surface was 3B.

Example 4

(1) Titanium dioxide (commercially available from Aladdin Reagent Company having an average particle size of about 60 nm) was loaded in the middle of a porcelain boat; the boat was placed into a reaction tube which was then placed at a high temperature section of a muffle furnace. Both ends of the reaction tube were tightly sealed with a rubber plug and were cooled with dripping water, and an atmosphere of ammonia gas was charged into the tube to replace the air within the tube. At the same time, a pH test paper was used to check the sealing condition of the reaction apparatus, and in the case of no ammonia leakage, the power was turned on, the ammonia flow rate was controlled at 2.4 $cm^3/s$. The temperature of the muffle furnace was raised to 800 degrees Celsius which was maintained for 5 hours, and then the boat was cooled down to 80 degrees Celsius under the ammonia gas atmosphere. After turning off the ammonia gas, the boat was taken out and placed in a desiccator to cool down to room temperature, and then a compound of formula I was obtained. The prepared titanium oxide was grinded to an average particle size of about 100 mm by high-speed ball mill, and the total volume of the titanium oxide was taken as a standard; about 30 volume % of the titanium oxide had a particle size of about 1 to 50 nm. After being measured, the obtained titanium oxide is $TiO_{0.9}$.

(2) 100 g titanium oxide prepared in step (1), 12 g ink vehicle (commercially available from Rohm and Haas Company, USA under a trademark of A-11), 100 g ethanol, 0.6 g dispersant (commercially available from BYK Company, Germany under a trademark of BYK-220 S), 0.4 g defoamer (commercially available from BYK Company, Germany under a trademark of BYK-065), 0.5 g flatting agent (commercially available from BYK Company, Germany under a trademark of BYK-306) and 0.3 g sodium polyacrylate (commercially available from Aladdin Reagent Company) were evenly mixed to obtain the ink composition of the present example.

(3) The ink composition was applied to a surface of a $ZrO_2$ substrate by using inkjet method, and was dried for about 5 hours at a temperature of 170 degrees Celsius, and thereby an ink layer was formed on the substrate surface, and the ink layer had a thickness of about 30 μm.

(4) A metal layer was formed on the substrate surface obtained in step (2) by a method which is substantially the same as step (4) in Example 3.

After being measured, the plate layer had a thickness of about 50 μm, the plating rate was 91 μm/h, and the adhesion force of the metal layer formed on the substrate surface was 3B.

Example 5

The ink composition was prepared and the substrate surface was metalized by a method which is substantially the same as the method in Example 4, with the following exceptions: the prepared titanium oxide was grinded to an average particle size of about 60 mm by high-speed ball mill, and the total volume of the titanium oxide was taken as a standard; about 90 volume % of the titanium oxide had a particle size of about 1 to 50 nm.

After being measured, the plate layer had a thickness of about 50 μm, the plating rate was 92 μm/h, and the adhesion force of the metal layer formed on the substrate surface was 4B.

Example 6

The ink composition was prepared and the substrate surface was metalized by a method which is substantially the same as the method in Example 4, with the following exceptions: in step (3), after being dried for 5 hours at a temperature of 170 degrees Celsius, the ink composition was subjected to heat treatment at a temperature of about 500 degrees Celsius for 5 hours in a nitrogen atmosphere.

After being measured, the plate layer had a thickness of about 50 μm, the plating rate was 96 m/h, and the adhesion force of the metal layer formed on the substrate surface was 4B.

Example 7

The ink composition was prepared and the substrate surface was metalized by a method which is substantially the same as the method in Example 6, with the following exceptions: in step (3), after being dried for 5 hours at a temperature of 170 degrees Celsius, the ink composition was subjected to heat treatment at a temperature of about 700 degrees Celsius for 3 hours in a nitrogen atmosphere.

After being measured, the plate layer had a thickness of about 50 μm, the plating rate was 100 m/h, and the adhesion force of the metal layer formed on the substrate surface was 5B.

Example 8

The ink composition was prepared and the substrate surface was metalized by a method which is substantially the same as the method in Example 4, with the following exceptions: in step (3), 100 g ink composition prepared in step (2) was evenly mixed with $Ni_2O_3$ (compared to 100 g ink composition, the usage amount of the $Ni_2O_3$ was 14 g) to form a mixture, then the obtained mixture was applied onto a surface of a $ZrO_2$ ceramic substrate by an ink-jet printing method, after being dried for 5 hours at a temperature of 170 degrees Celsius, the ink composition was subjected to heat treatment at a temperature of about 500 degrees Celsius for 5 hours in a nitrogen atmosphere.

After being measured, the plate layer had a thickness of about 50 μm, the plating rate was 97 m/h, and the adhesion force of the metal layer formed on the substrate surface was 5B.

Example 9

(1) Nano-titanium dioxide (commercially available from Aladdin Reagent Company having an average particle size of about 60 nm) was loaded in the middle of a porcelain boat; the boat was placed into a reaction tube which was then placed at a high temperature section of a muffle furnace. Both ends of the reaction tube were tightly sealed with a rubber plug and were cooled with dripping water, and an atmosphere of ammonia gas was charged into the tube to replace the air within the tube. At the same time, a pH test paper was used to check the sealing condition of the reaction apparatus, and in the case of no ammonia leakage, the power was turned on, the ammonia flow rate was controlled at 5 cm³/s. The temperature of the muffle furnace was raised to 900 degrees Celsius which was maintained for 5 hours, and then the boat was cooled down to 80 degrees Celsius under the ammonia gas atmosphere. After turning off the ammonia gas, the boat was taken out and placed in a desiccator to cool down to room temperature, then a compound of formula I was obtained. The prepared titanium oxide was grinded to an average particle size of about 50 mm by high-speed ball mill, and the total volume of the titanium oxide was taken as a standard; about 90 volume % of the titanium oxide had a particle size of about 1 to 50 nm. After being measured, the obtained titanium oxide is $TiO_{1.2}$.

(2) 100 g titanium oxide prepared in step (1), 30 g ink vehicle (commercially available from Japan's Kuraray Chemical Company under a trademark of Mowital B 75H), 100 g ethanol, 4 g triolein (commercially available from BYK Company, Germany under a trademark of BYK-220 S), 3 g defoamer (commercially available from BYK Company, Germany under a trademark of BYK-022), 0.5 g flatting agent (commercially available from BYK Company, Germany under a trademark of BYK-306) and 0.3 g sodium polyacrylate (commercially available from Aladdin Reagent Company) were evenly mixed to obtain the ink composition of the present example.

(3) The ink composition was applied onto a surface of a paper substrate by using an ink-jet printing method, and was dried for about 3 hours at a temperature of 50 degrees Celsius, and thereby an ink an ink layer was formed on the substrate surface, and the ink layer had a thickness of about 30 μm.

(4) A metal layer was formed on the substrate surface obtained in step (2) by a method which is substantially the same as step (4) in Example 3.

After being measured, the plate layer had a thickness of about 40 μm, the plating rate was 92 m/h, and the adhesion force of the metal layer formed on the substrate surface was 4B.

Example 10

The ink composition was prepared and the substrate surface was metalized by a method which is substantially the same as the method in Example 9, with the following exceptions: in step (1), a $TiO_2$ having an average particle size of about 200 nm was subjected to calcination, the prepared titanium oxide was grinded to an average particle size of about 200 mm by high-speed ball mill, and the total volume of the titanium oxide was taken as a standard; about 10 volume % of the titanium oxide had a particle size of about 1 to 50 nm.

After being measured, the plate layer had a thickness of about 40 μm, the plating rate was 89 m/h, the plate layer formed had a thickness of about 15 μm, and the adhesion force of the metal layer formed on the substrate surface was 2B.

Example 11

(1) Nano-titanium dioxide (commercially available from Aladdin Reagent Company having an average particle size of about 60 nm) was loaded in the middle of a porcelain boat; the boat was placed into a reaction tube which was then placed at a high temperature section of a muffle furnace. Both ends of the reaction tube were tightly sealed with a rubber plug and were cooled with dripping water, and an atmosphere of ammonia gas was charged into the tube to replace the air within the tube. At the same time, a pH test paper was used to check the sealing condition of the reaction apparatus, and in the case of no ammonia leakage, the power was turned on, the ammonia flow rate was controlled at 5 cm$^3$/s. The temperature of the muffle furnace was raised to 800 degrees Celsius which was maintained for 8 hours, and then the boat was cooled down to 80 degrees Celsius under the ammonia gas atmosphere. After turning off the ammonia gas, the boat was taken out and placed in a desiccator to cool down to room temperature, and then a compound of formula I was obtained. The prepared titanium oxide was grinded to an average particle size of about 50 mm by high-speed ball mill, and the total volume of the titanium oxide was taken as a standard; about 90 volume % of the titanium oxide had a particle size of about 1 to 50 nm. After being measured, the obtained titanium oxide is $TiO_{1.1}$.

(2) 50 g titanium oxide prepared in step (1), 1 g ink vehicle (commercially available from Eastman Chemical Company under a trademark of CAB381-2), 20 g dimethylbenzene, 0.2 g dispersant (commercially available from Witco Corp., USA under a trademark of PS-21A), 0.2 g defoamer (commercially available from BYK Company, Germany under a trademark of BYK-051), 0.3 g flatting agent (commercially available from BYK Company, Germany under a trademark of BYK-333) and 0.3 g polyamide wax (commercially available from German Klein Company under a trademark of FA1) were evenly mixed to obtain the ink composition of the present example.

(3) The ink composition obtained in step (2) was evenly mixed with $SiO_2$ (comparing to 100 g ink composition, the usage amount of the $SiO_2$ was 5 g) to form a mixture, then the obtained mixture was applied onto a surface of a glass substrate by a lithograph method, after being dried for 5 hours at a temperature of 90 degrees Celsius, the ink composition was then subjected to heat treatment at a temperature of about 1000 degrees Celsius for 2 hours to form an ink layer on the substrate surface, and the ink layer had a thickness of about 15 µm.

(4) A metal layer was formed on the substrate surface obtained in step (2) by a method which is substantially the same as step (4) in Example 3.

After being measured, the plate layer had a thickness of about 20 µm, the plating rate was 97 µm/h, and the adhesion force of the metal layer formed on the substrate surface was 4B.

Example 12

The ink composition was prepared and the substrate surface was metalized by a method which is substantially the same as the method in Example 11, with the following exceptions: that in step (3), the ink composition was subjected to heat treatment at a temperature of about 900 degrees Celsius for 2 hours.

After being measured, the plate layer had a thickness of about 20 µm, the plating rate was 100 m/h, and the adhesion force of the metal layer formed on the substrate surface was 5B.

Example 1'

(1) 80 g CuO and 80 g $Fe_2O_3$ were mixed evenly to form a mixture, the mixture was then subjected to grinding for 12 hours in a ball mill under a media of ethanol, after the ball-mill product was dried, the dried mixture was subjected to calcination for 5 hours at a temperature of 750 degrees Celsius under a mixture atmosphere of hydrogen and nitrogen (the volume ratio between hydrogen and nitrogen was 2:1) to form a calcinated product, and the calcinated product was then grinded to an average particle size of about 80 nm. The prepared product was $CuFeO_{3.98}$.

(2) 100 g product prepared in step (1), 15 g polyvinyl butyral (commercially available from Kuraray Company, Japan under a trademark of Mowital) and 20 g toluene were evenly mixed to obtain an ink composition according to the present example.

(3) The ink composition prepared in step (2) was applied onto a surface of a $Al_2O_3$ ceramic substrate by an ink-jet printing method, the ink composition was dried for 3 hours at a temperature of about 120 degrees Celsius, and then was subjected to heat treatment at a temperature of about 800 degrees Celsius for 2 hours under a nitrogen atmosphere, and thereby an ink layer was formed on the substrate surface, and the ink layer had a thickness of 12 µm.

(4) The substrate prepared in step (3) was subjected to electronic plating to form a copper plate; and current intensity was 3A/cm$^2$.

Example 2'

The ink composition was prepared and the substrate surface was metalized by a method which is substantially the same as the method in Example 1', with the following exceptions: in step (3), a process of subjecting to heat treatment at a temperature of about 800 degrees Celsius for 5 hours under a nitrogen atmosphere was omitted.

Example 3'

(1) 80 g CuO and 80 g $Fe_2O_3$ were mixed evenly to form a mixture, the mixture was then subjected to grinding for 12 hours in a ball mill under a media of ethanol, after the ball-mill product was dried, the dried mixture was subjected to calcination for 6 hours at a temperature of 800 degrees Celsius under a mixture atmosphere of hydrogen and nitrogen (the volume ratio between hydrogen and nitrogen was 1:1) to form a calcinated product, and the calcinated product was then grinded to an average particle size of about 100 nm. The prepared product was $CuFeO_{3.9}$.

(2) 100 g product prepared in step (1), 20 g ink vehicle (commercially available from Eastman Company, USA under a trademark of CAB381-0.5), 100 g n-heptanol, 2 g dispersant (commercially available from BYK Company, Germany under a trademark of DISPERBYK-165), 0.2 g defoamer (commercially available from BYK Company, Germany under a trademark of BYK-051), 0.4 g flatting agent (commercially available from BYK Company, Germany under a trademark of BYK-333) and 0.5 g hydrogenated castor oil (commercially available from Wuhan JIN-NUO Chemical Co., Ltd.) were evenly mixed to obtain an ink composition of the present example.

(3) After mixing the ink composition prepared in step (2) with an epoxy resin binder to form a mixture, the mixture was applied onto a surface of a polyimide (PI) substrate by a laser printing method, and dried for 2 hours at a temperature of about 100 degrees Celsius, then the ink composition was subjected to curing at a temperature of about 120 degrees Celsius for 1.5 hours, thereby an ink layer was formed on the substrate surface, and the ink layer had a thickness of about 15 µm; for the epoxy resin binder, the epoxy resin was a bisphenol A-type epoxy resin (the epoxide value was 0.58 mol/100 g); the curing agent was phthalic anhydride; based on 100 weight parts of the ink composition prepared in step (2), the usage amount of the epoxy resin was 10 g, the usage amount of the curing agent was 7.2 g.

(4) The substrate prepared in step (3) was subjected to electronic plating to form a copper plate, and current intensity was 2A/cm$^2$.

Example 4'

The ink composition was prepared and the substrate surface was metalized by a method which is substantially the same as the method in Example 3', with the following exceptions: in step (3), the epoxy resin binder is not used.

Example 5'

(1) 80 g CuO and 80 g $Fe_2O_3$ were mixed evenly to form a mixture, the mixture was then subjected to grinding for 12 hours in a ball mill under a media of ethanol, after the ball-mill product was dried, the dried mixture was subjected to calcination for 12 hours at a temperature of 1000 degrees Celsius under a mixture atmosphere of hydrogen and nitrogen (the volume ratio between hydrogen and nitrogen was 2:1) to form a calcinated product, and the calcinated product was then grinded to an average particle size of about 80 nm. The prepared product was $CuFeO_{3.2}$.

(2) The ink composition was prepared by a method which is substantially the same as step (2) in Example 1', with the following exceptions: a metal composition was the metal composition prepared in step (1) in Example 5'.

(3) The ink composition prepared in step (2) was evenly mixed with $Ni_2O_3$ (based on 100 weight parts of the ink composition, the usage amount of $Ni_2O_3$ was 14 g) to form a mixture, the mixture obtained was applied onto a surface of a $ZrO_2$ ceramic substrate by an ink-jet printing method, and the mixture was dried for 3 hours at a temperature of about 120 degrees Celsius, and then the dried mixture was subjected to heat treatment at a temperature of about 900 degrees Celsius in a nitrogen atmosphere for 1 hours, thereby an ink layer was formed on the substrate layer, and the ink layer had a thickness of about 20 μm.

(4) The substrate prepared in step (3) was placed in a plating solution to perform a chemical plating. The compositions of the plating solution were: 0.12 mol/L $CuSO_4.5H_2O$ 0.14 mol/L $Na_2EDTA.2H_2O$, 10 mg/L potassium ferrocyanide, 10 mg/L 2,2'-bipyridine, 0.10 mol/L glyoxylic acid. The plating solution was adjusted to a pH of about 12.5-13 by using solutions of NaOH and $H_2SO_4$, and a temperature of the plating solution was 50 degrees Celsius.

Example 6'

The ink composition was prepared and the substrate surface was metalized by a method which is substantially the same as the method in Example 5', with the following exceptions: in step (3), $Ni_2O_3$ is not used.

Example 7'

(1) $CaCu_3Ti_4O_{12}$ (according to Fu Qiang etc, Preparation method published in (Preparation method of $CaCu_3Ti_4O_{12}$ ceramics and property thereof, Wuhan University Academic Journey (Natural Science Version) 54(4): 381-384, 2008, being similar thereafter) was subjected to calcination at a temperature of about 1000 degrees Celsius for 2 hours in a mixture atmosphere of hydrogen and nitrogen (the volume ratio between hydrogen to nitrogen gas is 2:1) to form a calcined product, and then the calcined product was grinded in a ball-mill to an average of about 100 nm. The prepared product was $Ca_{0.25}Cu_{0.75}TiO_{2.65}$.

(2) 100 g product prepared in step (1), 30 g EVA ink vehicle (commercially available from Eastman Company, USA), 110 g toluene, 3 g dispersant (commercially available from BYK Company, Germany under a trademark of ANTI-TERRA-U 80), 0.5 g defoamer (commercially available from BYK Company, Germany under a trademark of BYK-065), 0.5 g flatting agent (commercially available from BYK Company, Germany under a trademark of BYK-306) and 0.4 g hydroxyethyl cellulose (commercially available from Luzhou North Fangtai Dong Chemical Company) were evenly mixed to obtain an ink composition according to the present example.

(3) The ink composition prepared in step (2) was applied onto a surface of a polyether ether ketone (PEEK) substrate, and dried at a temperature of about 150 degrees Celsius for 4 hours, thereby an ink layer was formed on the substrate surface having a thickness of about 25 μm.

(4) The substrate prepared in step (3) was subjected to electronic plating by a method which is substantially the same as the method in Example 3'.

Example 8'

The substrate surface was metalized by a method which is substantially the same as the method in Example 1', with the following exceptions: a metal compound was prepared by following method: $CaCu_3Ti_4O_{12}$ was subjected to calcination at a temperature of about 800 degrees Celsius for 5 hours in a mixture atmosphere of hydrogen and nitrogen (the volume ratio between hydrogen to nitrogen gas is 2:1) to form a calcined product, and then the calcined product was grinded in a ball-mill to an average of about 80 nm. The prepared product was $Ca_{0.1}CH_{0.9}TiO_{2.95}$.

Example 9'

The ink composition was prepared and the substrate surface was metalized by a method which is substantially the same as the method in Example 8', with the following exception: in step (3), a process of subjecting to heat treatment at a temperature of about 800 degrees Celsius for 5 hours under a nitrogen atmosphere was omitted.

Example 10'

The ink composition was prepared and the substrate surface was metalized by a method which is substantially the same as the method in Example 8', with the following exceptions: the ink composition prepared in step (2) was evenly mixed with $SiO_2$ (comparing to 100 g ink composition, the usage amount of $SiO_2$ was 10 g) to form a mixture, the mixture was then applied onto a surface of a $Al_2O_3$ ceramic substrate by an ink-jet printing method, thereby an ink layer was formed on the substrate surface.

Example 11'

The ink composition was prepared and the substrate surface was metalized by a method which is substantially the same as the method in Example 8', with the following exceptions: a metal compound was prepared by following method: 100 g $CaCO_3$, 240 g CuO and 320 g $TiO_2$ were evenly mixed to form a mixture, and then the mixture was placed in a ball-mill and subjected to grinding for 8 hours with absolute ethyl alcohol as solvent to obtain a grinded product. After being dried, the grinded product was subjected to calcination at a temperature of about 800 degrees Celsius for about 10 hours to form a calcinated product. The calcinated product was subjected to calcination at a temperature of about 900 degrees Celsius for about 4 hours in an atmosphere of high purity argon, then re-calcinated product was subjected to grinding to an average particle size of about 100 nm in a ball-mill. The final product was $Ca_{0.25}Cu_{0.75}TiO_{2.84}$.

Example 12'

The ink composition was prepared and the substrate surface was metalized by a method which is substantially the same as the method in Example 11', with the following exception: in step (3), the epoxy resin binder is not used.

Example 13'

The ink composition was prepared and the substrate surface was metalized by a method which is substantially the same as the method in Example 1', with the following exceptions: a metal compound was prepared by following method: 4 g MgO and 18.7 g $Ga_2O_3$ were evenly mixed to form a mixture, then the mixture was placed in a ball-mill and subjected to grinding for 12 hours with water as media to obtain a grinded product. After being dried, the grinded product was subjected to calcination at a temperature of about 1000 degrees Celsius for about 12 hours to form a calcinated product. Then the calcinated product was subjected to grinding to an average particle size of about 80 nm. The final prepared product was $MgGa_2O_{3.8}$.

Example 14'

(1) 54.1 g CuO (commercially available from Aladdin Reagent Company with an average particle size of about 40 nm), 27.1 g $Fe_2O_3$ (commercially available from Aladdin Reagent Company with an average particle size of about 100 nm) and 26.9 g $Mn_2O_3$ (commercially available from Aladdin Reagent Company with an average particle size of about 200 nm) were evenly mixed to form a mixture, and then the mixture was placed in a ball-mill and subjected to calcination at a temperature of about 1000 degrees Celsius for 10 hours to obtain a calcinated product. The obtained calcinated product was subjected to grinding to an average particle size of about 80 nm. The final prepared product was $CuFe_{0.5}Mn_{0.5}O_{2.5}$.

(2) 100 g final product prepared in step (1), 16 g ink vehicle (commercially available from Eastman Company, USA under a trademark of CAB381-20), 80 g trichloroethylene, 4 g dispersant (commercially available from BYK Company, Germany under a trademark of BYK-220 S), 3 g defoamer (commercially available from BYK Company, Germany under a trademark of BYK-065), 0.5 g flatting agent (commercially available from BYK Company, Germany under a trademark of BYK-306) and 0.3 g sodium polyacrylate (commercially available from Aladdin Reagent Company) was evenly mixed to obtain an ink composition according to the present example.

(3) The ink composition prepared in step (2) was applied onto a surface of a polycarbonate (PC) substrate by a laser printing method, and dried at a temperature of about 120 degrees Celsius for 5 hours, thereby an ink layer was formed on the substrate surface having a thickness of about 20 µm.

(4) The substrate surface was metalized by a method which is substantially the same as the method in Example 1'.

Example 15'

The ink composition was prepared and the substrate surface was metalized by a method which is substantially the same as the method in Example 3', with the following exception: the metal compound was the product prepared by a method which is substantially the same as step (1) in Example 14'.

Example 16'

The ink composition was prepared and the substrate surface was metalized by a method which is substantially the same as the method in Example 1', with the following exception: the metal compound was the product prepared by a method which is substantially the same as the method in Example 14'.

Example 17'

The ink composition was prepared and the substrate surface was metalized by a method which is substantially the same as the method in Example 16', with the following exception: in step (3), a process of subjecting to heat treatment at a temperature of about 800 degrees Celsius for 5 hours under a nitrogen atmosphere was omitted.

Example 18'

The ink composition was prepared and the substrate surface was metalized by a method which is substantially the same as the method in Example 5', with the following exceptions: a metal compound was prepared by following method: 54.1 g CuO (commercially available from Aladdin Reagent Company with an average particle size of about 40 nm), 27.1 g $Fe_2O_3$ (commercially available from Aladdin Reagent Company with an average particle size of about 100 nm) and 17.3 g $Al_2O_3$ (commercially available from Aladdin Reagent Company with an average particle size of about 100 nm) were evenly mixed to form a mixture, and then the mixture was subjected to calcination at a temperature of 1000 degrees Celsius for 10 hours in a $N_2$ atmosphere to obtain a calcinated product. Then the calcinated product was subjected to grinding to powder having an average particle size of about 80 nm in a ball-mill. The final product prepared was $CuFe_{0.5}Al_{0.5}O_{2.5}$.

Example 19'

The ink composition was prepared and the substrate surface was metalized by a method which is substantially the same as the method in Example 1', with the following exceptions: a metal compound was prepared by following method: 54.1 g CuO (commercially available from Aladdin Reagent Company with an average particle size of about 40 nm), 13.6 g $Fe_2O_3$ (commercially available from Aladdin Reagent Company with an average particle size of about 100 nm), 8.7 g $Al_2O_3$ (commercially available from Aladdin Reagent Company with an average particle size of about 100 nm) and 26.9 g $Mn_2O_3$ (commercially available from Aladdin Reagent Company with an average particle size of about 200 nm) were evenly mixed to form a mixture, then the mixture was subjected to calcination at a temperature of 1000 degrees Celsius for 10 hours in a $NH_3$ atmosphere to obtain a calcinated product. Then the calcinated product was subjected to grinding to powder having an average particle size of about 100 nm in a ball-mill. The final product prepared was $CuFe_{0.25}Al_{0.25}Mn_{0.5}O_{2.5}$.

Example 20'

The ink composition was prepared and the substrate surface was metalized by a method which is substantially the same as the method in Example 19', with the following exception: in step (3), the ink composition prepared in step (2) was evenly mixed with $SiO_2$ (comparing to 100 g ink composition, the usage amount of $SiO_2$ was 10 g) to form a mixture, the obtained mixture was applied onto a surface of a $Al_2O_3$ by an ink-jet printing method.

Example 21'

The ink composition was prepared and the substrate surface was metalized by a method which is substantially the same as the method in Example 3', with the following exceptions: a metal compound was prepared by following method: 58 g CuO, 34 g $Ga_2O_3$ and 14 g $B_2O_3$ were evenly mixed to form a mixture, then the mixture was placed in a ball-mill and subjected to grinding for 12 hours with water as media to obtain a grinded product. After being dried, the grinded product was subjected to calcination at a temperature of about 1000 degrees Celsius for about 12 hours under a mixture atmosphere of hydrogen and nitrogen (the volume ratio between hydrogen and nitrogen was 2:1) to obtain a calcinated product. The calcinated product was then grinded to an average particle size of about 80 nm. The prepared product was $CuGa_{0.5}B_{0.5}O_{2.5}$.

Example 22'

The ink composition was prepared and the substrate surface was metalized by a method which is substantially the same as the method in Example 1', with the following exception: a metal compound was the metal compound prepared in Example 21'.

Example 23'

The ink composition was prepared and the substrate surface was metalized by a method which is substantially the same as the method in Example 22', with the following exception: in step (3), a process of subjecting to heat treatment at a temperature of about 800 degrees Celsius for 5 hours under a nitrogen atmosphere was omitted.

Example 24'

The ink composition was prepared and the substrate surface was metalized by a method which is substantially the same as the method in Example 1', with the following exceptions: a metal compound was prepared by following method: 80 g CuO, 40 g $Fe_2O_3$ and 17 g $B_2O_3$ were evenly mixed to form a mixture, and then the mixture was placed in a ball-mill and subjected to grinding for 12 hours with water as media to obtain a grinded product. After being dried, the grinded product was subjected to calcination at a temperature of about 1000 degrees Celsius for about 12 hours under a mixture atmosphere of hydrogen and nitrogen (the volume ratio between hydrogen and nitrogen was 2:1) to obtain a calcinated product. The calcinated product was then grinded to an average particle size of about 80 nm. The prepared product was $CuFe_{0.5}B_{0.5}O_{2.5}$.

Example 25'

The ink composition was prepared and the substrate surface was metalized by a method which is substantially the same as the method in Example 24', with the following exception: in step (3), a process of subjecting to heat treatment at a temperature of about 800 degrees Celsius for 5 hours under a nitrogen atmosphere was omitted.

Example 26'

The ink composition was prepared and the substrate surface was metalized by a method which is substantially the same as the method in Example 3', with the following exception: a metal compound was the metal compound prepared in Example 24'.

Example 27'

The ink composition was prepared and the substrate surface was metalized by a method which is substantially the same as the method in Example 1', with the following exception: a metal compound was prepared by following method: 45 g $Ni_2O_3$, 80 g CuO and 18 g $B_2O_3$ were evenly mixed to form a mixture, then the mixture was placed in a ball-mill and subjected to grinding for 12 hours with water as media to obtain a grinded product. After being dried, the grinded product was subjected to calcination at a temperature of about 1000 degrees Celsius for about 12 hours under a mixture atmosphere of hydrogen and nitrogen (the volume ratio between hydrogen and nitrogen was 2:1) to obtain a calcinated product. The calcinated product was then grinded to an average particle size of about 80 nm. The prepared product was $CUNi_{0.5}B_{0.5}O_{2.5}$.

Example 28'

The ink composition was prepared and the substrate surface was metalized by a method which is substantially the same as the method in Example 1', with the following exceptions: a metal compound was prepared by following method: 80 g CuO and 25 g $B_2O_3$ were evenly mixed to form a mixture, and then the mixture was placed in a ball-mill and subjected to grinding for 12 hours with water as media to obtain a grinded product. After being dried, the grinded product was subjected to calcination at a temperature of about 900 degrees Celsius for about 6 hours under an air atmosphere. The calcinated product was then grinded to an average particle size of about 80 nm. The prepared product was $CuB_{0.7}O_2$.

Example 29'

The ink composition was prepared and the substrate surface was metalized by a method which is substantially the same as the method in Example 1', with the following exceptions: a metal compound was prepared by following method: 75 g $Ni_2O_3$ and 128 g $MoO_3$ were evenly mixed to form a mixture, and then the mixture was placed in a ball-mill and subjected to grinding for 12 hours with water as media to obtain a grinded product. After being dried, the grinded product was subjected to calcination at a temperature of about 900 degrees Celsius for about 6 hours under an $N_2$ atmosphere. The calcinated product was then grinded to an average particle size of about 80 nm. The prepared product was $NiMoO_{3.8}$.

Example 30'

The ink composition was prepared and the substrate surface was metalized by a method which is substantially the same as the method in Example 3', with the following exception: a metal compound was the metal compound prepared in Example 29'.

Example 31'

The ink composition was prepared and the substrate surface was metalized by a method which is substantially the same as the method in Example 5', with the following exceptions: a metal compound was prepared by following method: 75 g $Ni_2O_3$ and 128 g $MoO_3$ were evenly mixed to form a first mixture, and then the mixture was placed in a ball-mill and subjected to grinding for 12 hours with water as media to obtain a grinded product. After being dried, the grinded product was subjected to calcination at a temperature of about 900 degrees Celsius for about 8 hours under a $N_2$ atmosphere. The calcinated product was then grinded to an average particle size of about 80 nm; in step (3), the ink composition prepared in step (2) was evenly mixed with $Ni_2O_3$ (comparing to 100 g ink composition, the usage amount of $Ni_2O_3$ was 15 g) to form a second mixture, the second mixture was applied on to a surface of a $Al_2O_3$ ceramic substrate by an ink-jet printing method. The prepared product was $NiMoO_{3.5}$.

Example 32'

The ink composition was prepared and the substrate surface was metalized by a method which is substantially the same as the method in Example 29', with the following exception: in step (3), a process of subjecting to heat treatment at a temperature of about 800 degrees Celsius for 5 hours under a nitrogen atmosphere was omitted.

Comparative Example 1

The ink composition was prepared and the substrate surface was metalized by a method which is substantially the same as the method in Example 1', with the following exception: the metal compound was replaced by silver powders having an average particle of about 80 nm.

The plating rate, thickness of the formed metal layer, adhesion force and signal intensitie in Example 1'-32' and Comparative Example 1 were shown in Table 1.

TABLE 1

| No. | Metal compound | substrate | Plating rate ($\mu m \cdot h^{-1}$) | Thickness of metal layer ($\mu m$) | Adhesion force | Signal intensity |
|---|---|---|---|---|---|---|
| Example 1' | $CuFeO_{3.98}$ | $Al_2O_3$ | 100 | 30 | 4B | −100 |
| Example 2' | $CuFeO_{3.98}$ | $Al_2O_3$ | 95 | 30 | 3B | −100 |
| Example 3' | $CuFeO_{3.9}$ | PI | 96 | 30 | 4B | −100 |
| Example 4' | $CuFeO_{3.9}$ | PI | 95 | 30 | 3B | −100 |
| Example 5' | $CuFeO_{3.2}$ | $ZrO_2$ | 3.1 | 20 | 5B | −100 |
| Example 6' | $CuFeO_{3.2}$ | $ZrO_2$ | 2.9 | 20 | 4B | −100 |
| Example 7' | $Ca_{0.25}Cu_{0.75}TiO_{2.65}$ | PEEK | 90 | 25 | 4B | −105 |
| Example 8' | $Ca_{0.1}Cu_{0.9}TiO_{2.95}$ | $Al_2O_3$ | 94 | 30 | 4B | −103 |
| Example 9' | $Ca_{0.1}Cu_{0.9}TiO_{2.95}$ | $Al_2O_3$ | 89 | 30 | 3B | −103 |
| Example 10' | $Ca_{0.1}Cu_{0.9}TiO_{2.95}$ | $Al_2O_3$ | 95 | 30 | 5B | −103 |
| Example 11' | $Ca_{0.25}Cu_{0.75}TiO_{2.84}$ | PI | 91 | 30 | 4B | −103 |
| Example 12' | $Ca_{0.25}Cu_{0.75}TiO_{2.84}$ | PI | 89 | 30 | 3B | −103 |
| Example 13' | $MgGa_2O_{3.8}$ | $Al_2O_3$ | 68 | 30 | 4B | −103 |
| Example 14' | $CuFe_{0.5}Mn_{0.5}O_{2.5}$ | PC | 84 | 30 | 3B | −101 |
| Example 15' | $CuFe_{0.5}Mn_{0.5}O_{2.5}$ | PI | 83 | 30 | 4B | −101 |
| Example 16' | $CuFe_{0.5}Mn_{0.5}O_{2.5}$ | $Al_2O_3$ | 91 | 30 | 4B | −101 |
| Example 17' | $CuFe_{0.5}Mn_{0.5}O_{2.5}$ | $Al_2O_3$ | 87 | 30 | 3B | −101 |
| Example 18' | $CuFe_{0.5}Al_{0.5}O_{2.5}$ | $ZrO_2$ | 2.5 | 20 | 5B | −101 |
| Example 19' | $CuFe_{0.25}Al_{0.25}Mn_{0.5}O_{2.5}$ | $Al_2O_3$ | 87 | 30 | 4B | −101 |
| Example 20' | $CuFe_{0.25}Al_{0.25}Mn_{0.5}O_{2.5}$ | $Al_2O_3$ | 87 | 30 | 5B | −101 |
| Example 21' | $CuGa_{0.5}B_{0.5}O_{2.5}$ | PI | 77 | 30 | 4B | −102 |
| Example 22' | $CuGa_{0.5}B_{0.5}O_{2.5}$ | $Al_2O_3$ | 84 | 30 | 4B | −102 |
| Example 23' | $CuGa_{0.5}B_{0.5}O_{2.5}$ | $Al_2O_3$ | 78 | 30 | 3B | −102 |
| Example 24' | $CuFe_{0.5}B_{0.5}O_{2.5}$ | $Al_2O_3$ | 86 | 30 | 4B | −101 |
| Example 25' | $CuFe_{0.5}B_{0.5}O_{2.5}$ | $Al_2O_3$ | 80 | 30 | 3B | −103 |
| Example 26' | $CuFe_{0.5}B_{0.5}O_{2.5}$ | PI | 80 | 30 | 4B | −103 |
| Example 27' | $CuNi_{0.5}B_{0.5}O_{2.5}$ | $Al_2O_3$ | 83 | 30 | 4B | −104 |
| Example 28' | $CuB_{0.7}O_2$ | $Al_2O_3$ | 80 | 30 | 4B | −104 |
| Example 29' | $NiMoO_{3.8}$ | $Al_2O_3$ | 77 | 30 | 4B | −103 |
| Example 30' | $NiMoO_{3.8}$ | PI | 67 | 30 | 4B | −103 |
| Example 31' | $NiMoO_{3.5}$ | $ZrO_2$ | 2.1 | 20 | 5B | −103 |
| Example 32' | $NiMoO_{3.8}$ | $Al_2O_3$ | 66 | 30 | 3B | −103 |
| Comparative Example 1 | Ag powder | $Al_2O_3$ | 95 | 30 | 4B | −100 |

Reference throughout this specification to "an embodiment," "some embodiments," "one embodiment", "another example," "an example," "a specific examples," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example, "in an example," "in a specific examples," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments can not be construed to limit the present disclosure, and changes, alternatives, and modifications can be made in the embodiments without departing from spirit, principles and scope of the present disclosure.

What is claimed is:

1. An article, comprising:
an ink layer including an ink composition applied on a surface of the article, and
a metal layer plated on the ink layer,
wherein the ink composition comprises a metal compound and an ink vehicle,
wherein the metal compound includes at least one selected from a group consisting of a compound of formula I and a compound of formula II, $$TiO_{2-\sigma} \qquad (I),$$

$$M^1M^2_pO_q \qquad (II),$$

wherein $0.05 \leq \sigma < 1.8$,
$M^1$ includes at least one element selected from a group consisting of groups 2, 9-12 of the periodic table according to IUPAC nomenclature,
$M^2$ includes at least one element selected from a group consisting of groups 3-8, 10 and 13 of the periodic table according to IUPAC nomenclature, and
$0 < p \leq 2$, and
$0 < q < 4$.

2. The article according to claim 1, wherein based on 100 weight parts of the metal compound, the content of the ink vehicle is about 1 to 30 weight parts.

3. The article according to claim 1, wherein the metal compound has an average particle size of 1 nm to 1 micron.

4. The article according to claim 1, wherein based on the total volume of the compound of formula I, about 50 to 100 volume % of the compound of formula I has a particle size of about 1 to 50 nm.

5. The article according to claim 1, further comprising a solvent, wherein based on 100 weight parts of the metal compound, the content of the solvent is about 20 to 200 weight parts.

6. The article according to claim 1, wherein $M^1$ includes one element selected from a group consisting of group 11 of the periodic table according to IUPAC nomenclature, $M^2$ comprises $M^{21}$ and $M^{22}$,
wherein
$M^{21}$ includes one element selected from a group consisting of group 8 of the periodic table according to IUPAC nomenclature,
$M^{22}$ includes at least one element selected from a group consisting of groups 13 and 7 of the periodic table according to IUPAC nomenclature, and
a molar ratio between $M^{21}$ and $M^{22}$ is about 1:0.1-10.

7. The article according to claim 6, wherein $M^{22}$ comprises $M^{221}$ and $M^{222}$,
wherein
$M^{221}$ includes one element selected from a group consisting of group 13 of the periodic table according to IUPAC nomenclature,
$M^{222}$ includes one element selected from a group consisting of group 7 of the periodic table according to IUPAC nomenclature, and
a molar ratio between $M^{221}$ and $M^{222}$ is about 1:0.1-10.

8. The article according to claim 6, wherein $M^1$ is Cu, $M^{21}$ is Fe, and $M^{22}$ is at least one selected from Mn and Al.

9. The article according to claim 1, wherein $M^1$ includes one element selected from a group consisting of group 2 of the periodic table according to IUPAC nomenclature,
$M^2$ includes one element selected from a group consisting of group 13 of the periodic table according to IUPAC nomenclature.

10. The article according to claim 1, wherein $M^1$ includes one element selected from a group consisting of group 10 of the periodic table according to IUPAC nomenclature,
$M^2$ includes one element selected from a group consisting of group 6 of the periodic table according to IUPAC nomenclature.

11. The article according to claim 10, wherein $M^1$ is Ni, $M^2$ is Mo.

12. The article according to claim 1, wherein $M^1$ includes one element selected from a group consisting of group 11 of the periodic table according to IUPAC nomenclature,
$M^2$ includes at least one element selected from a group consisting of group 13 of the periodic table according to IUPAC nomenclature, or $M^2$ comprises at least one element selected from a group consisting of group 13 of the periodic table according to IUPAC nomenclature and at least one element selected from a group consisting of groups 8 and 10 of the periodic table according to IUPAC nomenclature.

13. The article according to claim 12, wherein $M^2$ comprises $M^{23}$ and $M^{24}$,
$M^{23}$ includes one element selected from a group consisting of groups 8, 10 and 13 of the periodic table according to IUPAC nomenclature,
$M^{24}$ is B,
$M^{23}$ and $M^{24}$ are different, and a molar ratio of $M^{23}$ and $M^{24}$ is about 1:0.1-10.

14. The article according to claim 13, wherein $M^1$ is Cu, and
$M^{23}$ is Ga, or $M^{23}$ comprises Ga and at least one selected from Fe and Ni.

15. The article according to claim 1, wherein $M^1$ includes at least one selected from a group consisting of Mg, Ca, Sr, Ba, Co, Ni, Cu, Zn, and
$M^2$ includes at least one selected from a group consisting of Sc, Y, Ti, Zr, Hf, V, Nb, Ta, Cr, Mo, W, Mn, Fe, Ru, B, Al, Ga, In.

16. The article according to claim 1, wherein the metal compound includes at least one selected from the group consisting of a compound of formula III, $CuFe_{0.5}Mn_{0.5}O_{2.5}$, $CuFe_{0.5}Al_{0.5}O_{2.5}$, $CuFe_{0.5}Al_{0.25}Mn_{0.5}O_{2.5}$, a compound of formula IV, a compound of formula V, $CuFe_{0.5}B_{0.5}O_{2.5}$, $CuNi_{0.5}B_{0.5}O_{2.5}$, $CuGa_{0.5}B_{0.5}O_{2.5}$, $CuB_{0.7}O_2$, and a compound of formula VI, $$CuFeO_{4-\delta} \qquad (III),$$

$$MgGa_2O_{4-\lambda} \qquad (IV),$$

$$NiMoO_{4-\mu} \qquad (V),$$

$$Ca_\alpha Cu_{1-\alpha}TiO_{3-\beta} \qquad (VI),$$

wherein $0 < \delta \leq 3$, $0 < \lambda \leq 3$, $0 < \mu \leq 3$, $0 \leq \alpha < 1$ and $\beta$ is about 0-2.

17. An ink composition, comprising a metal compound and an ink vehicle, wherein the metal compound includes at least one selected from a group consisting of a compound of formula I and a compound of formula II, $$TiO_{2-\sigma} \quad (I),$$

$$M^1M^2_pO_q \quad (II),$$

wherein 0.05≤σ<1.8,
0<p≤2, and
0<q<4, and
wherein $M^1$ includes one element selected from a group consisting of group 11 of the periodic table according to IUPAC nomenclature,
$M^2$ includes one element selected from a group consisting of group 8 of the periodic table according to IUPAC nomenclature.

18. The composition according to claim 17, wherein $M^1$ is Cu and $M^2$ is Fe.

19. An article obtained by a method of metalizing a surface of an insulation substrate, the method comprising the steps of:
applying an ink composition onto a surface to be metalized of the insulation substrate to obtain an insulation substrate with an ink layer; and
plating at least one metal layer onto the insulation substrate with the ink layer,
wherein the ink composition comprises a metal compound and an ink vehicle,
wherein the metal compound includes at least one selected from a group consisting of a compound of formula I and a compound of formula II, $$TiO_{2-\sigma} \quad (I),$$

$$M^1M^2_pO_q \quad (II),$$

wherein 0.05≤σ<1.8,
$M^1$ includes at least one element selected from a group consisting of groups 2, 9-12 of the periodic table according to IUPAC nomenclature,
$M^2$ includes at least one element selected from a group consisting of groups 3-8, 10 and 13 of the periodic table according to IUPAC nomenclature, and
0<p≤2, and
0<q<4.

* * * * *